(12) United States Patent
Savas et al.

(10) Patent No.: US 7,799,685 B2
(45) Date of Patent: Sep. 21, 2010

(54) SYSTEM AND METHOD FOR REMOVAL OF PHOTORESIST IN TRANSISTOR FABRICATION FOR INTEGRATED CIRCUIT MANUFACTURING

(75) Inventors: Stephen E. Savas, Fremont, CA (US); Songlin Xu, Fremont, CA (US); David Dutton, Tracy, CA (US); Andreas Kadavanich, Fremont, CA (US); Rene George, San Jose, CA (US)

(73) Assignee: Mattson Technology, Inc., Fremont, CA (US)

( * ) Notice: Subject to any disclaimer, the term of this patent is extended or adjusted under 35 U.S.C. 154(b) by 932 days.

(21) Appl. No.: 10/958,866

(22) Filed: Oct. 4, 2004

(65) Prior Publication Data

US 2005/0112883 A1    May 26, 2005

Related U.S. Application Data

(60) Provisional application No. 60/511,029, filed on Oct. 13, 2003.

(51) Int. Cl.
*H01L 21/302* (2006.01)
*H01L 21/461* (2006.01)

(52) U.S. Cl. .................. 438/689; 438/637; 438/725

(58) Field of Classification Search ........................ None
See application file for complete search history.

(56) References Cited

U.S. PATENT DOCUMENTS 4,861,424 A    8/1989  Fujimura et al.
4,861,732 A    8/1989  Fujimura et al.
4,980,022 A    12/1990 Fujimura et al.
5,403,436 A    4/1995  Fujimura et al.
5,660,682 A    8/1997  Zhao et al.
5,811,358 A *  9/1998  Tseng et al. ............... 438/725
6,007,671 A    12/1999 Fujimura et al.
6,028,015 A    2/2000  Wang et al.
6,030,901 A    2/2000  Hopper et al.
6,080,529 A    6/2000  Ye et al.
6,204,192 B1   3/2001  Zhao et al.
6,271,121 B1 * 8/2001  Webb ......................... 438/627
6,281,135 B1   8/2001  Han et al.

(Continued)

OTHER PUBLICATIONS

Hirose et al, Ion-Implanted Photoresist and Damage-Free Stripping, Jan. 1994, J Electrochem Soc., vol. 141, No. 1, pp. 192-205.
U.S. Appl. No. 09/962,255, filed Oct. 19, 2000.

*Primary Examiner*—Nadine G Norton
*Assistant Examiner*—Mahmoud Dahimene
(74) *Attorney, Agent, or Firm*—Pritzkau Patent Group, LLC.

(57) ABSTRACT

In a technique for fabricating an integrated circuit to include an active device structure which supports an electrical interconnect structure, a photoresist layer is used prior to forming an electrical interconnect structure on the active device structure. The photoresist and related residues are removed by exposing the photoresist and exposed regions of the active device structure to one or more reactive species that are generated using a gas mixture including hydrogen gas, as a predominant source of the reactive species, in a plasma source such that the photoresist and residues are continuously exposed to hydrogen-based reactive species. An associated system architecture is described which provides for a substantial flow of hydrogen gas in the process chamber.

23 Claims, 7 Drawing Sheets

U.S. PATENT DOCUMENTS

| | | |
|---|---|---|
| 6,313,042 B1 | 11/2001 | Cohen et al. |
| 6,331,380 B1 | 12/2001 | Ye et al. |
| 6,412,497 B1 | 7/2002 | Li et al. |
| 6,457,477 B1 | 10/2002 | Young et al. |
| 6,536,449 B1 | 3/2003 | Ranft et al. |
| 6,599,829 B2 | 7/2003 | Smith et al. |
| 6,630,406 B2 | 10/2003 | Waldfried et al. |
| 6,736,927 B2 | 5/2004 | Wang et al. |
| 6,805,139 B1 | 10/2004 | Savas et al. |
| 7,014,887 B1 * | 3/2006 | Cohen et al. ................ 427/534 |
| 2001/0053594 A1 | 12/2001 | Xiang et al. |
| 2002/0185151 A1 * | 12/2002 | Qingyuan et al. ............ 134/1.2 |
| 2003/0220708 A1 * | 11/2003 | Sahin et al. ................. 700/121 |
| 2004/0238123 A1 * | 12/2004 | Becknell et al. ........ 156/345.33 |

* cited by examiner

| ENERGY/ ION TYPE | 20 eV | 30 eV | 40 eV | 50 eV | 60 eV | 100 eV | 150 eV | 200 eV | 500 eV |
|---|---|---|---|---|---|---|---|---|---|
| Hydrogen | 0 | 0 | 0 | 0 | 0 | 0 | .006 | .01 | .015 |
| Helium | | | .018 | | .08 | .12 | | | |
| Oxygen | .04 | .17 | | .28 | .31 | .47 | | | |
| Nitrogen | | .16 | | | | .44 | | | |
| Argon | .001 actual < 1 E-5 | | .02 | | | | | | .49 |
| Arsenic into Si @ 10 keV = 2.12 | | | | | | | | | |

Figure 5

SYSTEM AND METHOD FOR REMOVAL OF PHOTORESIST IN TRANSISTOR FABRICATION FOR INTEGRATED CIRCUIT MANUFACTURING

RELATED APPLICATION

The present application claims priority from U.S. Provisional Application Ser. No. 60/511,029 filed on Oct. 13, 2003, which is incorporated herein by reference.

BACKGROUND OF THE INVENTION

The present invention is related generally to semiconductor fabrication and, more particularly, to a system and method for removal of photoresist in front-end fabrication as part of integrated circuit manufacturing.

A schematic of a standard configuration of a photoresist (PR) stripping chamber and source is shown in FIG. 1. Gas coming from a set of flow controllers and valves 101, passes via tubing 102 to a plasma source 103. There, the gas becomes substantially dissociated (and partially ionized) and then goes through a distribution/baffling system 104 into a wafer process enclosure 105. A pedestal 106 holds a wafer 107 which is to be stripped of PR and residues. On the wafer, radicals react with the PR and residues to form volatile or water-soluble reaction products that are then pumped out by ducts 108. This type of PR stripping chamber is widely used because it provides almost entirely neutral reactive species to strip the PR and does not subject the wafer to large amounts of charged particles that might damage the sensitive materials and layers used in making the integrated circuits. Such stripping systems are used for removing PR both during the early stages of IC fabrication, when the transistors are being fabricated, as well as the later stages when the interconnecting metal lines are made to connect the transistors in the desired circuit pattern and to external circuits.

There are several specific PR stripping applications done in the early stage of transistor fabrication, including stripping after ion implantation and stripping after etching used to pattern layers or make openings. The most critical of these stripping processes are those done after high dose ion implantation, after etching to pattern the gate electrode, and after etching to create openings to connect to the junctions and gate of the transistors. The latter are called the "contact" etches. PR removal processes for these applications may use a single step, but commonly employ two or even more steps. It is submitted that current PR stripping processes for these applications will become inadequate to meet all process requirements in the near future as the size of transistors continues to shrink and the thickness of critical layers on the wafer surface continues to decrease.

Processes for removing high dose implanted PR very frequently use multiple steps. The reason is the complex physical structure of the implanted PR. Usually, the first one or two steps are gas-phase done with apparatus such as in FIG. 1, while the final cleaning step for residues is often done with wet chemicals—usually in baths. The physical structure of the resist after high dose ion implantation is shown in FIG. 2, generally indicated by the reference number 200. A first layer 201 is a hardened "crust" which has received most of the ion dose when it was used as a mask during implantation. Research has shown that the crust is a graphitic, highly crosslinked, predominantly carbon polymer when there is sufficient dose of ions. The remaining PR (so called "bulk"), which has not been ion implanted, is indicated by the reference number 202. It can be seen that the crust and the bulk PR contact silicon 203, with the crust partially or completely enveloping the bulk. When wafers are stripped following high dose implant (HDI) in a single high-temperature (>200 Celsius) step, "popping" of the photoresist crust occurs. In this "popping", the high temperature causes solvents contained in the bulk resist to go into the gas phase and pressure to build up underneath the crust. When the pressure builds sufficiently, it causes the hardened crust to rupture or detach from the silicon to vent the built-up pressure. In single step stripping of such HDI PR, popping is tolerated and ignored. Once the crust pops, both the bulk PR and the crust etch much more quickly in standard oxygen-based stripping processes—normally done between 200 Celsius and 300 Celsius. The particles that remain after such a single-step dry stripping process are usually physically and chemically removed by a wet bath clean, often including physical agitation such as Megasonic.

However, since the structure of the PR after implantation is two-layered with very different material characteristics, it is often the case that two or more gas-phase process steps are used to remove it. This is especially true in cases where it is important to reduce particulate levels following the stripping. One reason is that hardened crust, unlike bulk PR, is very hard to strip with normal reactive radicals. In most multistep stripping processes, the first step removes the crust at reduced wafer temperature (<120 Celsius) to avoid popping. Because of the low wafer temperature, additional reaction activation mechanisms need to be provided to achieve adequate stripping rate and productivity. One such method is to use gaseous additives, which accelerates the etching of the carbon polymer crust. Otherwise the stripping of crust in pure oxygen is often so slow that the cost is prohibitively high. Such additives may include fluorinated gases or mixtures containing hydrogen and nitrogen. Such gas mixtures passed through the plasma source produce other reactive species in addition to atomic oxygen which promote the attack of the crust material—as found by Hirose in Journal of the Electrochemical Society, 1994. Such methods, however, still do not yield fast and highly productive etching of the crust. Therefore, other techniques for activating the etching of the crosslinked carbon polymer crust are often needed. In many such processes, ion-bombardment has been used to provide such activation energy to accelerate the etching of the crust.

The second step to remove the remaining bulk PR (which has not been chemically altered during the ion implantation) is done at higher wafer temperature than the crust etching step—normally at least 200 Celsius—to speed up the etching rate. Thus, after the crust is breached and there is no further danger of popping, since pressure cannot build up, the temperature may be higher. At this stage, the bulk PR is accessible to the gas phase species and such photoresist, not altered by ion implantation, quickly etches chemically. This step is very similar to normal PR stripping applications, since the underlayer of photoresist has been substantially unchanged by the patterning or doping process.

However, the stripping of the bulk photoresist is not normally the final step, due to the significant side-effects of ion implantation. Very often, there are difficult to remove residues remaining after removing most of the crust and all the bulk PR. Such residues are usually made up of the remnants of the implanted resist crust (carbon polymer, dopants and silicon oxide). Usually, silicon compounds are found mostly on the sidewalls of the photoresist, whereas most dopants are found deep inside the crust. The ion implantation process always causes some silicon dioxide or silicon exposed on the wafer surface to be sputtered. Such sputtered silicon will, in part, strike and condense on the sidewalls of the photoresist structures leaving one or more monolayers of silicon or silicon dioxide on the outer surface of the sidewall crust. This material does not normally (especially in oxygen-based stripping) chemically convert to loose and soluble form during the bulk resist step and may be chemically quite resistant. Therefore, a necessary final step in removal of implanted PR is often the residue removal step. This may or may not be done in the same system as the first two steps because it may in part require use of wet chemicals including strong acids or bases. When it is done in part in the same system used for crust and bulk stripping, it usually involves the use of gas additives to the normal oxygen gas injected into the plasma source. Common additives are fluorinated gases as well as mixtures containing nitrogen and/or hydrogen, particularly "forming gas" (FG) which is at least 90% nitrogen or noble inert gas and the remainder hydrogen. Such additives help to convert the residues to a water-soluble form that will be removed by a deionized (DI) water rinse. It is common for such residue removal steps to still leave some un-reacted residues that are not removed in a DI water rinse. Such remnant residues will need to be removed by a wet chemical bath since the wafers need to be completely clean prior to the following process, high temperature thermal annealing of the dopant in the silicon.

Stripping processes following the "gate" etching (polysilicon for the current and next IC technology generation) step have typically been two step processes as well since there are almost always substantial silicon-containing residues remaining after the PR is stripped using the normally oxygen-based gas mixture. Such residues have sometimes been removed by adding to the injected mixture of gases a small flow of fluorinated carbon gas such as carbon tetrafluoride or hexafluoroethane. These provide small concentrations of atomic fluorine and other reactive species that chemically attack the silicon-containing residues and either remove it or leave a loose, water-soluble ash on the surface. Unfortunately, fluorine-containing gas addition has been shown in high temperature stripping processes to attack the gate dielectric—typically silicon dioxide or oxynitride. Fluorine atoms thus are passing right through the polysilicon gate electrode material to react with the dielectric. Sometimes a gas mixture using forming gas has been substituted for fluorinated gas so that there is a reduced effect on the gate dielectric material. The potential vulnerability of the gate and gate dielectric materials to the stripping process will likely increase as technology advances, due to the decreasing length of the gate which is typically about half the size of other critical features patterned on the wafer.

Last among critical stripping processes are those to remove PR following the contact etch. Contact etching processes are designed to stop when they reach the silicide or metal materials in the junctions and gate. Such materials will be changing over the coming generations of semiconductor technology. The dielectric that has been removed to make the holes is silicon dioxide. This must be etched to completion—often involving etching different amounts for holes connecting with gate versus source and drain—while not etching the silicides that are exposed at the bottom of the holes which have finished etching. Polymer residues containing silicon are very often left, following this etching, which need to be removed by the PR stripping process. Ideally, stripping processes will need to remove the PR and the residues without causing any loss of, harm or degradation of the materials exposed at the bottoms of the holes. Unfortunately, most silicide materials used for junctions including cobalt silicide and nickel silicide are sensitive to oxygen and degraded in performance by it. Two step processes may be used to successively remove the remaining PR after etching and then the residues that have substantial inorganic content.

Gas mixtures containing mainly oxygen have been the principal types of recipe used for all major stripping applications in transistor fabrication as part of IC manufacturing. This has been true for both the early patterning and ion implant steps involved in transistor fabrication as well as the later steps involved in making the interconnects or wires of the IC. Oxygen has been the gas of choice because atomic oxygen reacts more strongly with organic polymers like PR than most other radicals and is made from a very inexpensive gas that makes the process less expensive than when using other gases. Water vapor also produces high stripping rates but is not as inexpensive to deliver in gaseous form at high flow rates as is oxygen. Higher reactivity of species makes stripping rates faster, and faster rates make stripping system productivity higher. Such high rates have been an economic necessity for competitive stripping for many years because photoresist thickness for older lithography technologies (preceding Deep Ultraviolet lithography at 248 nanometers) has been greater than a micron or more. Since there are typically twenty or more photoresist removal steps in the IC manufacturing process, high stripping rates and productivity is needed in stripping to keep IC costs low for mass-market products. This means that stripping rates have needed to be several microns per minute or more.

Furthermore, until recently, surfaces exposed on the wafer during transistor fabrication (typically silicon dioxide) have been relatively insensitive to small amounts of silicon oxidation or silicon oxide loss. This made oxygen the preferred, safe and economic major gas ingredient for downstream plasma-based stripping of photoresist. Common gaseous additives to oxygen in such processes to improve process productivity and facilitate removal of residues during or following PR removal have included hydrogen or dilute mixtures of hydrogen in nitrogen (called forming gas) and fluorinated gases or mixtures of both. It has been found that small amounts of nitrogen/hydrogen gas additives modestly improve PR stripping rate.

Typically fluorine containing gas or dilute hydrogen mixtures such as forming gas is used following resist removal to help convert residues to forms soluble in water. Because such additives have not caused sufficient loss of silicon dioxide or damage to the silicon underneath it to adversely affect IC yield or reliability, addition of small percentages of such gases as FG or hydrogen or nitrogen or fluorine containing gases has been acceptable.

Gas mixtures having little or no oxygen or oxygen containing gas have been used with plasma-based systems since the early days of PR stripping where materials vulnerable to oxidation have been exposed on the wafer. One alternative to oxygen-based feed gases for stripping is hydrogen. In the early days of semiconductor IC fabs, hydrogen was employed as the main gas for stripping photoresist for some selected steps, during electrical interconnect formation, in the overall integrated circuit fabrication process to avoid oxidation of exposed interconnect metal on the wafers. Such an interconnect metal may include, for example, aluminum. This is currently the case for interconnect fabrication on integrated circuits where conducting wires on the wafer are made from copper. It is also true for other new materials such as low-k dielectrics. Consequently, processes employing high hydrogen concentration with no added oxygen are commonly used in the later stages of integrated circuit manufacture where copper and low-k dielectrics are exposed to the stripping reactive species (see for example, U.S. Pat. No. 6,630,406 issued to Walfried, et al.). In these processes, the hydrogen may also be used for reducing copper surfaces oxidized in previous steps.

Gas mixtures using hydrogen-containing gases with no oxygen have also been used for wafer surface treatments to avoid corrosion. In most cases, this was because metal surfaces or metal-containing residues left after stripping would form undesirable compounds on the surface of the wafer that would degrade the yield or performance of the IC. This and most other applications employing gas mixtures lacking oxygen have been steps in the fabrication of interconnects or wires between transistors.

High dose implanted PR crust etching using hydrogen rather than oxygen was first done prior to the sub-micron semiconductor technology era in a few factories. Conventional reactive ion etching systems (RIE) using some hydrogen-containing gas mixtures (principally a mixture of mostly nitrogen and a small percentage of hydrogen called "Forming Gas") were found to be capable of removing the hardened crust on the PR surface formed by high dose ion implantation, at low wafer temperatures to avoid "popping". The hydrogen-based treatment reduced the number of particulate defects found on the wafer surface after stripping the implanted PR. In particular, when the RIE systems used a small percentage of hydrogen gas highly diluted in nitrogen it successfully removed the crust so that a following step, usually employing a flow of oxygen radicals could then remove the remaining bulk PR. We have recognized that this worked because the wafer bombardment by energetic ions from the plasma provided energy to activate chemical reactions of radicals with the carbon polymer. This crust removal was done at low temperature to avoid popping of the crust, while the second step of bulk PR removal was preferably done at higher temperature, preferably with oxygen, to provide higher productivity. Such a gas mixture, having a small percentage of hydrogen in nitrogen [i.e., forming gas], was a safe and commonly used gas in semiconductor factories and considered safe for use in conventional PR stripping systems. Further, layer thicknesses such as, for example, silicon dioxide screen layers were extremely thick in the then-existing technology, on the order of 100 Angstroms, such that a considerable amount of damage or loss due to sputtering could be tolerated. However, concerns for problems such as wafer charging or contamination prevented the hydrogen-based processes using RIE from being commercially successful even in the earlier generations of IC fabrication technology.

The present invention resolves the foregoing difficulties and concerns while providing still further advantages, as will be described.

SUMMARY OF THE DISCLOSURE

A method is disclosed for use in a system which is configured for fabricating an integrated circuit on one or more workpieces. The system includes a front end that is operable at an ambient pressure for use in moving the workpieces, at least portions of which support a photoresist layer, into and out of the system and for removing the photoresist in a process chamber at a process pressure. The process pressure being less than the ambient pressure. The system includes a front end robot for moving the workpieces into and out of the system. In one aspect of the disclosure, the method includes configuring a first chamber to serve as a loadlock, in selective communication with the front end. A second chamber is arranged in selective communication with each of the first chamber and with the process chamber. A workpiece transfer arrangement is located in the second chamber for cooperating with the front end robot to transfer the workpieces between the front end and the process chamber in sequence through the first chamber and the second chamber such that the second chamber is isolated from the ambient pressure at all times during transfer of workpieces between the front end and the process chamber. A gas flow arrangement is connected to a plasma source to serve in providing a gas flow to the plasma source during a treatment process such that the plasma source produces reactive species from hydrogen, as a principal source of the reactive species, for use in exposing the workpieces to the reactive species during the treatment process to remove the photoresist layer.

In another aspect of the disclosure, as part of an overall technique for fabricating an integrated circuit on a wafer to include an active device structure which supports an electrical interconnect structure, and during an intermediate step, prior to forming the electrical interconnect structure, a patterned layer of photoresist is used in the overall technique, a method is described for removing the patterned layer of photoresist and related residues, prior to forming the electrical interconnect structure, by exposing the patterned layer of photoresist and the exposed regions of the active device structure to one or more reactive species that are generated using a gas mixture including hydrogen gas, as a predominant source of the reactive species, in a plasma source, to remove the patterned layer of photoresist and the related residues such that the photoresist and residues are continuously exposed to hydrogen-based reactive species during the removal of the photoresist and residues. Embodiments are described for use in removing ion implanted photoresist, for use in removing photoresist following a gate patterning etch and for use following a contact hole etch. Each embodiment may be performed in a single step or using two or more steps employing different hydrogen-based gas mixtures.

BRIEF DESCRIPTION OF THE DRAWINGS

The present invention may be understood by reference to the following detailed description taken in conjunction with the drawings briefly described below.

FIG. 5 is a table which illustrates sputtering yields for various types of ions on mono-crystalline silicon.

DETAILED DESCRIPTION

The following description is presented to enable one of ordinary skill in the art to make and use the invention and is provided in the context of a patent application and its requirements. Various modifications to the described embodiments will be readily apparent to those skilled in the art and the generic principles herein may be applied to other embodiments. Thus, the present invention is not intended to be limited to the embodiment shown but is to be accorded the widest scope consistent with the principles and features described herein. It is noted that the drawings are not to scale and are diagrammatic in nature.

It is recognized that, for purposes of current and future IC fabrication, there are serious concerns with respect to the integrity of the very thin layers—typically between 100 Angstroms and 300 Angstroms—to be used for junctions and for protective layers. As a side-effect, RIE, in addition to the difficulties which accompany its use such as discussed above (or any process activated by energetic ions) is known to sputter or damage surface layers. In the instance of upcoming device generations, many layers can no longer tolerate such sputtering damage or etching. Sputtered material may come from a silicon dioxide protective screen above the sensitive junction areas of the transistors or from the silicon itself, if there is no protective screen. As and example, in preceding generations of IC manufacture (including the 0.18 micron technology node), it was acceptable to lose up to ten or more Angstroms of the protective silicon dioxide layer protecting the silicon being implanted during the stripping and cleaning process. Currently (130 nm to 90 nm IC technologies), with ultra shallow junctions, less than one Angstrom of loss or oxidation of silicon is acceptable. Further concerns have come to light recently wherein even moderate energy hydrogen ions implanted into the silicon of such junctions will cause damage to the silicon of the junctions. Thus, prior art RIE-based etching of implanted PR crust is considered as unacceptable in many ways for current IC fabrication.

In future generations of semiconductor manufacturing technology, it will be a requirement to avoid even smaller amounts of silicon or silicon dioxide loss from the exposed surfaces of the transistor or contamination of the wafer by mobile metal. For the 65 nm IC production technology node, coming in a few years, loss or oxidation of even 0.5 Angstroms of the crystalline silicon of a junction (during the strip and clean following each high dose implant) may be unacceptable. For the 45 nm node, even less loss or damage will be tolerated. Sodium contamination levels consistently less than ten billion atoms per square centimeter after stripping will be required. Crust removal processes such as the prior art hydrogen/nitrogen RIE-based methods mentioned above which damage, sputter or contaminate the silicon or silicide do not meet such stringent requirements.

Figure 3:
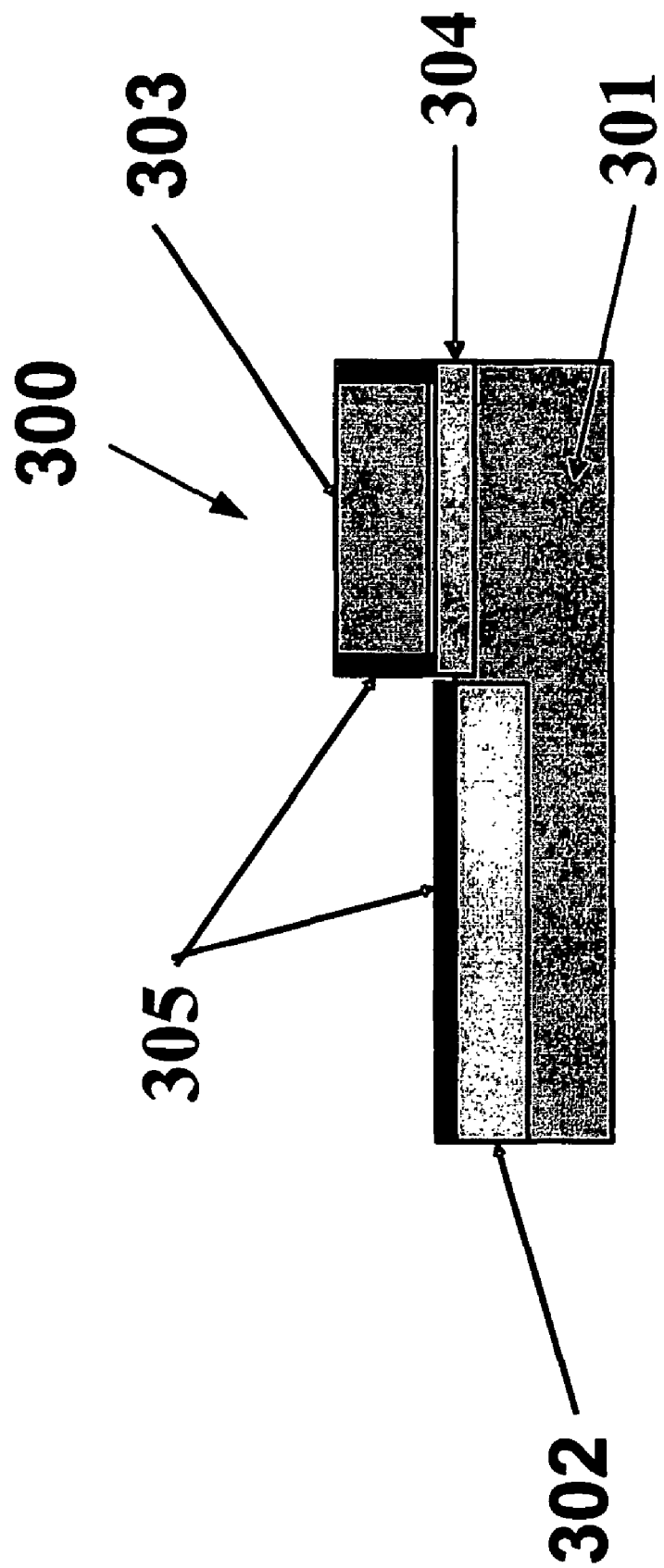
FIG. 3 is a diagrammatic elevational view of a portion of an integrated circuit transistor structure, shown here to illustrate sensitive areas of the transistor structure prior to the formation of sidewall spacers and deposition of an insulating layer.

Future generations of integrated circuits having critical dimension less than about 100 nanometers will be increasingly dependent on protecting the exposed or slightly protected silicon or silicide surfaces that are parts of the transistors being fabricated. It is important for the ultra shallow junctions in the source and drain regions of each transistor that there be minimal silicon loss or oxidation in this region following ion implantation. Also sensitive are the sidewalls of the gate electrode following patterning by etching. FIG. 3 is a schematic cross-sectional view of the areas of concern in an MOS transistor, generally indicated by the reference number 300. Shown as 301 is the substrate silicon, 302 is the junction, 303 is the gate electrode and 304 is the gate dielectric. The sensitive areas for silicon or silicide loss or oxidation are gate sidewalls 305 and a silicide layer 306 (which is typically not present until spacers—which are not shown for simplicity—have been fabricated adjacent to the gate electrode).

Figure 4:
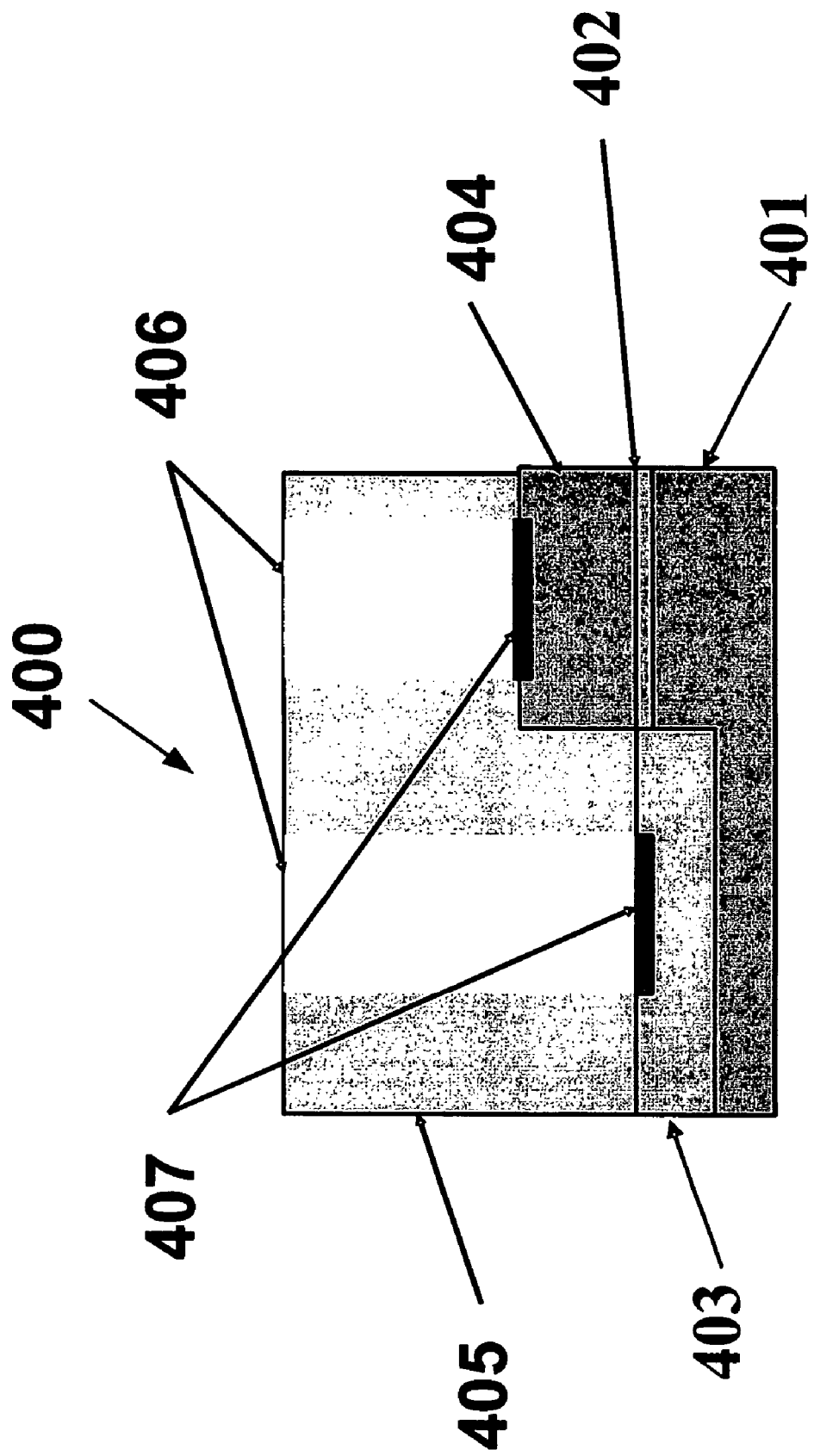
FIG. 4 is a diagrammatic view, in elevation, showing the structure of a portion of an MOS transistor, with openings in a first layer of dielectric insulation to permit electrical contacts to be made to one of the junctions and to the gate electrode of the transistor.

In MOS transistors, the contact areas with both the junctions and the gate sidewalls may also be sensitive to oxidation or other chemical degradation. FIG. 4 illustrates an MOS transistor, generally indicated by the reference number 400. In this figure, reference number 401 indicates the substrate silicon; reference number 402 indicates the gate dielectric; reference number 403 indicates the junction; reference number 404 indicates the gate electrode (sidewall spacers not shown to avoid unnecessary complexity in figure); reference number 405 indicates the dielectric insulation encapsulating the transistors; reference number 406 indicates the contact holes that are etched through the layer 405; and reference number 407 indicates the areas of potential damage to the junction and gate materials at the bottom of the contact holes. Thicknesses of critical layers at the bottom of these contact holes will soon be on the order of 100 Angstroms and, thus, degradation of their electrical properties such as, for example, conductivity are not acceptable.

In IC fabrication technology until now, during ion implantation for doping, the source and drain junction regions have been protected by a thin layer of silicon dioxide, typically less than or about 3 nanometers thick. This layer protects the surface from contamination and other damage during the ion implantation for the junctions. In fact, there can still be oxidation of the silicon under this layer when exposed to gaseous effluents from an oxygen plasma at temperatures of a few hundred degrees Celsius. Such a protective layer will be thinner, or not used at all by many manufacturers, at or beyond the 65 nanometer generation of IC devices, leaving the silicon surface less or not protected. Oxidation or etching of the silicon or silicon oxide during the photoresist or residue removal process following ion implantation will then result in the loss of valuable silicon and dopant at the junctions, and will therefore be undesirable. This will be particularly dangerous since the silicon will have been damaged by the ion impacts of the implant and therefore more rapidly oxidized by the oxygen atoms in the normal prior art PR stripping environment.

In prior art multi-step stripping processes for removal of HDI PR, there are a variety of side-effects on the exposed silicon or silicon dioxide at the junctions that need to be avoided. Ion bombardment, which may be used in either crust etching or residue removal steps, often causes loss of material by sputtering. For example, oxygen ions at 40 eV have substantial sputtering yield on silicon. FIG. 5 is a table, generally indicated by the reference number 500, giving the sputter yield coefficients for ions of various types and energies, as known. In fact, use of any gas that has atomic weight above that of helium can cause substantial sputtering, even for ion energies as low as 40 eV. It is noted that by using hydrogen gas, the minimum ion energy at which sputtering takes place is greatly increased (to over 100 eV) and, thereby, usually allows sputtering to be avoided whenever ion energies are less than about 100 eV. However, hydrogen atoms adsorbed on the surface of silicon or silicon dioxide can be activated by ion impact to etch the silicon—thereby causing silicon or silicon oxide loss. The use of pure hydrogen for the bulk stripping step—where there is no ion bombardment—will likely not cause as much silicon loss, but may cause some reduction of exposed silicon dioxide on the wafer surface. In the bulk stripping step, use of substantial amounts of oxygen gas will result in oxygen ion transport through any sacrificial or screen silicon dioxide layer to form a sub-oxide from the silicon of the junctions under the protective layer. In the residue removal step, when ion energy is applied to activate chemical reaction with residues (and junction surfaces are all exposed), there is likely to be sputtering loss of silicon or silicon dioxide if any gas heavier than helium is used as the dominant constituent of the plasma. Thus, use of conventional stripping chemistries with ion activated etching of crust or residues, will likely result in silicon or silicon oxide loss. Finally, bombardment by energetic hydrogen ions in any of the process steps will cause damage to the silicon of the junctions resulting in partially amorphous silicon with silicon hydrogen bonds being formed.

Oxygen-based PR stripping and residue removal following etching of a polysilicon gate electrode has not until now been limited by the silicon loss or oxidation it has caused on the sidewalls of the gate electrode. Past IC manufacturing yields were not affected by oxidation or loss of one to two nanometers of polysilicon because gate lengths have been fairly large (about 90 nanometers at the 150 nanometer technology node). Such effects on the polysilicon may come from two different mechanisms. First, the halogens (usually chlorine or bromine) liberated from PR or sidewall residues during oxygen-based stripping etch only a small amount of polysilicon. PR for current 130 nanometer technology does not contain fluorine in any substantial amount and will not be a significant source of halogen. Second, during the traditional oxygen-based stripping process, the silicon containing residues left on the sidewalls of the PR are to some extent converted to silicon oxide. This makes them hard to remove in a dry process step except by using substantial amounts of fluorinated gas in the stripping system. The use of fluorine in a residue removal step then may cause silicon loss from exposed areas of the gate electrode sidewalls. Total sidewall silicon loss from these causes could exceed a few nanometers and might vary from center to edge of the wafer. This silicon loss contributes to the total variation in gate length coming from the patterning process.

With current gate lengths of about 70 nanometers or less, it is believed there will be an increasing vulnerability to oxidation during stripping. Further, at the 65 nm technology node gate lengths will drop to 30 nm or less. At that time, IC manufacturers may also incorporate substantial fluorine in the PR for 193 nanometer lithography processing, up to 20% or more by weight, to improve transparency of the PR to the radiation. Some manufacturers will likely use hardmasks for patterning the gate electrode. This process employs PR to pattern a thin layer of another hard masking (either metal or amorphous carbon) material interposed between polysilicon or metal gate material and the photosensitive layer. Doing this will eliminate the effects on the sidewalls of the gate electrode just discussed because the PR and anti-reflective coating (ARC) layers will be stripped prior to patterning of the gate electrode. However, use of hardmasks entails extra process steps including deposition and removal of the hardmask and, therefore, raises the cost to make ICs on each wafer. When the entire cost of fabrication of a DRAM wafer is about $500 or less, the additional cost associated with additional deposition, patterning and removal of such a hardmask can be up to several percent or more of the total cost of the entire fabricated wafer. Therefore, some manufacturers will try to avoid hardmasks and do direct PR mask patterning of the gate electrodes. In this case, it is believed that oxygen-based stripping will cause sidewall oxidation or etching due to oxygen atoms or halogen atoms liberated from PR or residues. It is further believed that this will also cause oxidation of silicon-containing residues on the sidewall of the PR that will necessitate use of fluorine in any dry residue removal step following stripping. It is our concern that the sum of these effects on the gate length variation across the wafer, when added to intrinsic variation in the polysilicon etching process, may be unacceptable. Therefore, it is concluded that oxygen-containing gases may cause problems when used as principal gas in photoresist strip processes.

Manufacturers using hardmasks will strip the PR before etching the polysilicon, thereby avoiding direct exposure of the gate structure to the fluorine from the PR. However, even when the gate dielectric is covered and protected by the polysilicon layer it has been shown that the fluorine can diffuse through the polysilicon to affect gate capacitance. Therefore, it would be desirable for any stripping process to avoid liberation of fluorine into the chamber ambient in substantial amounts that could cause shifting of gate dielectric capacitance. In case dry stripping will be used for the hardmask removal and residue cleaning (likely for amorphous carbon hardmasks), it would be desirable that such processes do not cause oxidation of the sidewall of the gate—either metal or polysilicon. Current stripping processes using oxygen will very likely cause such fluorine liberation during hardmask and residue removal following the gate etch and also cause sidewall oxidation and we believe this may not be acceptable.

Another type of PR stripping process application used in transistor fabrication that will be oxygen sensitive is that following the etching of contacts. These etch processes are terminated when the etching has reached the surface of the junctions or the gate of the transistor that will consist of silicide or metal. In the case of junctions made of nickel silicide, it has recently been found that oxygen plasma exposure causes some silicon oxide formation on the nickel silicide surface. We believe that such exposure can impact the contact resistance to the silicide and the electrical conductivity of the material that is important to the speed of the IC. Therefore, we conclude that it will be increasingly undesirable to use oxygen-based dry stripping processes to remove PR and residues that remain after contact etches.

In view of the foregoing, stripping and residue removal processes for ion implanted PR, as well as the critical etching steps in transistor fabrication, will soon have problems if using large amounts of oxygen gas. Accordingly, it is proposed that hydrogen will become the principal source of chemically active species and substantial flows of it will likely be needed for stripping. Such systems currently using hydrogen usually do so as a minority additive in stripping processes. In these applications it is provided as a dilute admixture in nitrogen called "Forming Gas" which is about 4% hydrogen. This presents no danger of explosion, even in very large quantities since it is below the combustion threshold. Currently, strip processes wanting to use hydrogen often use a high flow of this mixture so as to avoid the need for special safety measures and features in the stripping system. However, ion activation may be needed in the near future to remove the tough residues following stripping of ion implanted resist since aggressive dry or wet cleaning results in silicon oxidation or loss. Additive inert gases such as nitrogen or helium, when fed to an ion source along with hydrogen, will cause sputtering of silicon when a bias is used to energize the ions. Therefore, large diluting flows of inert gases will not be acceptable and large flows of hydrogen will be needed, at least for some steps in the stripping and residue cleaning following ion implantation.

Figure 6:
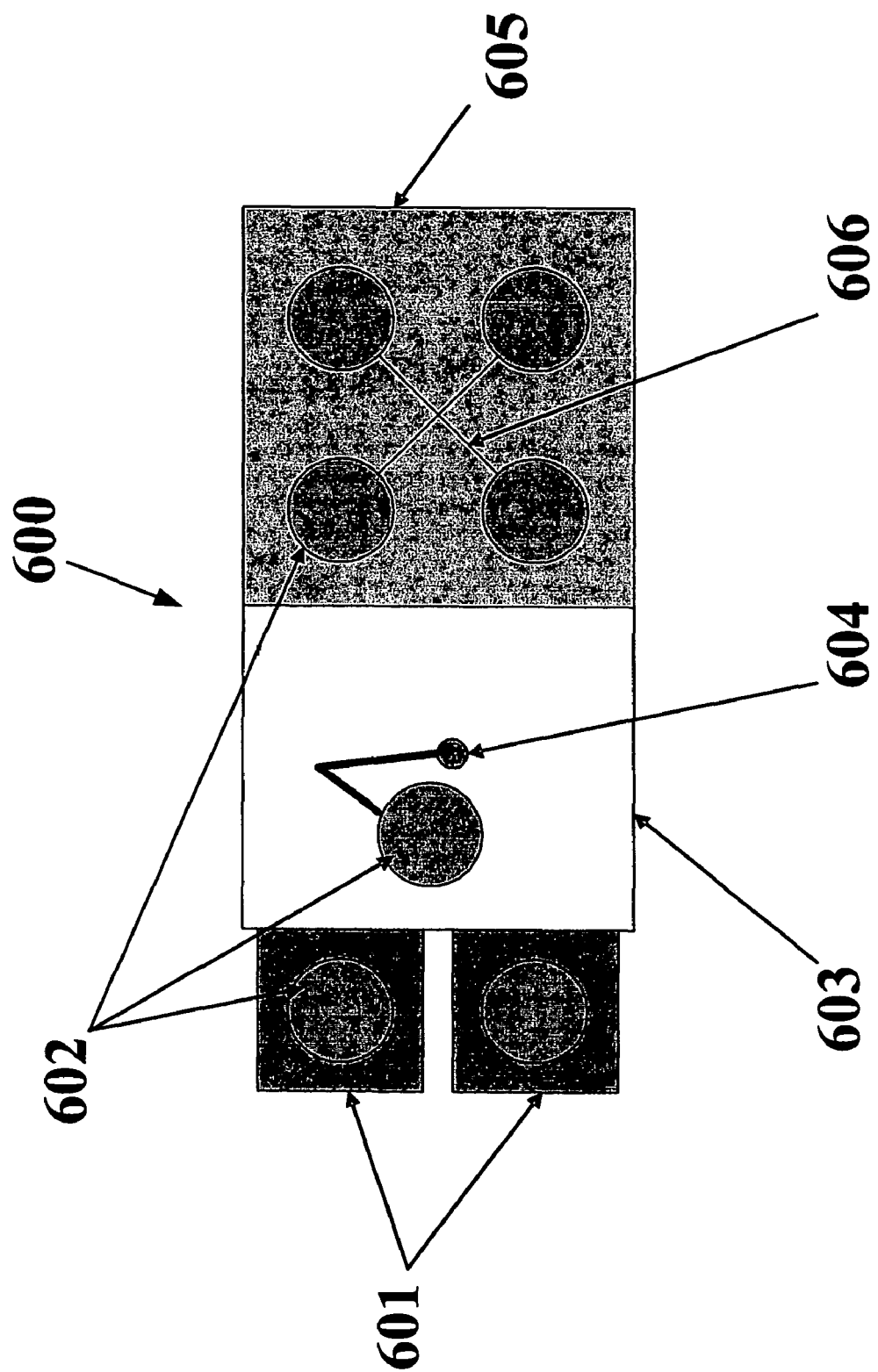
FIG. 6 is a diagrammatic plan view of a non-loadlocked conventional stripping system for semiconductor wafers having a multiple wafer processing station in the processing chamber.

Therefore, stripping systems that will need to use large amounts of hydrogen gas will require particular measures to avoid leakage of even small amounts of gas to the environment. This is more economically necessary since the costs for factory and equipment are so high—IC Fabs are the most expensive factories in the world at this time. Many PR stripping systems in use today do not have special safety systems to employ substantial amounts of hydrogen gas in processes. FIG. 6 is a conceptual drawing of the layout of a normal prior art stripping system, generally indicated by the reference number 600. This figure shows wafer loadports 601 feeding wafers 602 to a handling system 604, which puts them into a loadlock 603 from which they are loaded into a processing chamber 605. Wafers 602, to be processed in processing chamber 605, are indexed/rotated to different processing locations by a substrate rotation device 606. Such a system can allow substantial hydrogen leakage from the loadlock chamber under some circumstances. Since this will not be adequately safe for the fab in the future, it will be necessary to take special precautions in the wafer handling and vacuum system of the stripping tool.

The present invention includes a method for PR stripping and removing residues during transistor fabrication in integrated circuit wafer manufacturing using hydrogen gas as the dominant source of reactive species. Such processes may be multi-step and may have different gas compositions, gas pressures, wafer temperatures and plasma source configuration for each step. Different steps in the same process may be performed in different chambers. All of these process steps use hydrogen as an exclusive or main source of reactive species, but may, for some applications, also contain substantial amounts of noble gases. A common feature of many process steps is that the gas mixture may include small amounts of oxygen, nitrogen, and/or fluorine containing gases. We have found the surprising result that both the effectiveness and the rate of removal of PR and residues in some process steps is significantly enhanced by the addition to the injected gas of very small amounts of gases having such species. We have further observed that process steps using such mixtures, in many cases, produce less damage or etching of the sensitive exposed surfaces than use of pure hydrogen or mixtures only including noble gases with hydrogen.

Figure 1:
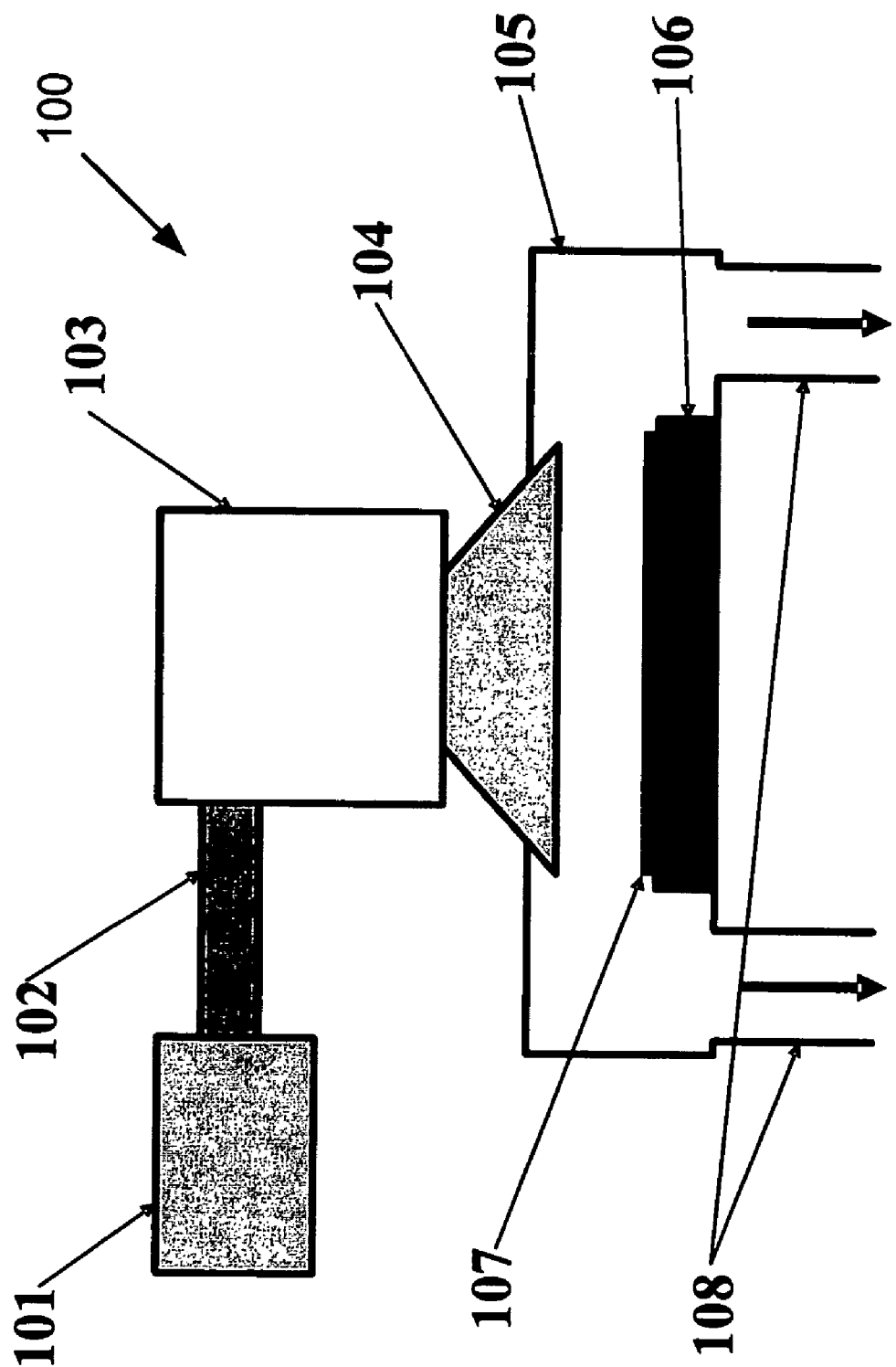
FIG. 1 is a diagrammatic illustration, in elevation, of a conventional downstream, plasma-based, photoresist stripping system that is useful in carrying out a number of embodiments of the method of the present invention.
Figure 2:
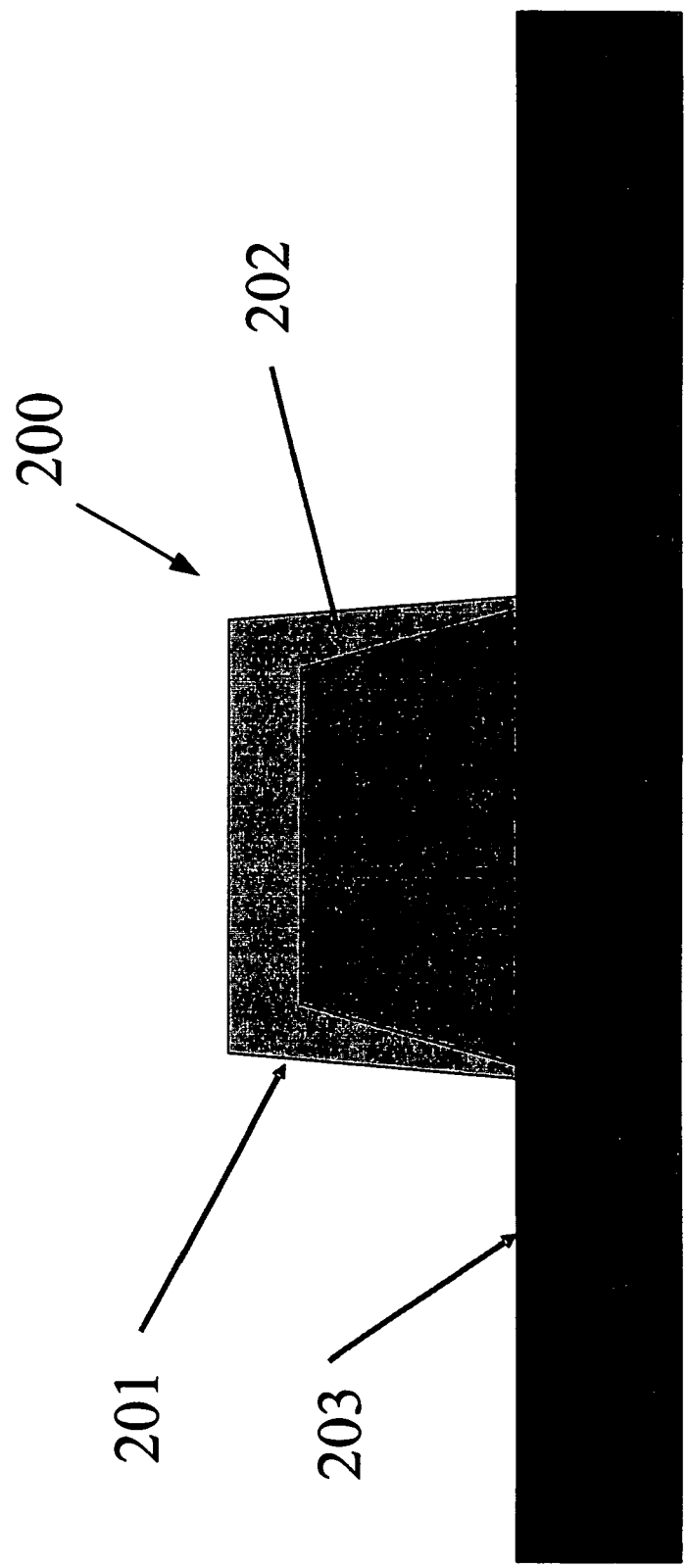
FIG. 2 is a diagrammatic illustration, in elevation, of the structure of a photoresist feature that has been heavily ion implanted causing a hardened crust to form.

Stripping with such a gas recipe should be done in an automated PR stripping system that may use an RF discharge plasma as a source for generating reactive radicals from injected gas. In such a case, the wafer may be either remote from the plasma source for a given step, as shown in FIG. 1, or may be in another well-known configuration wherein the wafer is positioned adjacent to the plasma in the source. In the latter case, it is also well-known to provide a bias which causes reactive ions to bombard the wafer. The stripping system may also include a double load-locked wafer handling system for improved safety, as will be described below with reference to FIG. 7. This invention is not appropriate or effective for anisotropic etching of PR, which includes applications called dry development, since the high gas flows and process recipes are likely to cause undercut of the mask.

The particular stripping applications that may be done to advantage using this invention include those where surfaces which will become part of the transistors are exposed to the process chamber ambient or have protective layers less than a few tens of Angstroms covering such surfaces, such as shown in FIG. 3 and described above. The first important specific application is in stripping following ion implantation of the junctions, more particularly, the so-called extension implants. Another is stripping of PR or hardmask material and residue removal following etching to pattern the gate electrode. A third important application is PR stripping and residue removal following the dielectric etching (so-called contact etching) that makes openings in the insulating layer for connections to the gate and junctions of the transistors. The disclosed invention uses specific gas mixtures and process conditions for removing PR and residues for each of these different applications. Processing wafers with the conditions disclosed below, especially for IC devices at or beyond the 90 nanometer semiconductor technology node, results in superior integrated circuit performance. The significant advantage of these methods over the prior art resides in removing resist and residues while not damaging or removing more than an Angstrom of the thin protective dielectric layer on the wafer, or causing critical silicon or suicides that form part of the transistors to be oxidized or lost.

For the above applications, processes may often be done either in a single step or in multiple steps, though multiple steps may give superior results in many cases. Any such step may, as an alternative embodiment of the disclosed method, use energetic ion bombardment. Steps that use energetic ion bombardment should use a stripping chamber configuration where the wafer is adjacent to the plasma source. The exact proportions of hydrogen, noble gas and oxygen, nitrogen or fluorine containing gases in the gas mixtures that may be used for embodiments of the invention depend on both the total gas pressure, and whether power is used to provide bombarding energy to ions. The gas mixture for embodiments of the invention will also depend on whether the plasma source is adjacent to, or separated from the wafer. If the plasma source is isolated from the wafer, neutral radicals are substantially responsible for the process and ion-induced sputtering is absent.

In particular steps, in applications that benefit from ion activation, embodiments of this invention may place the wafer adjacent to the plasma source. The plasma source, in this case, produces the needed ions as well as the neutral radicals to react with and volatize the organic polymer in the PR and/or convert residues. In this case, embodiments of the invention may also include providing an RF bias to the wafer-holding pedestal to accelerate the ions.

Precise composition of the gas mixture depends on the application and step in the process. In most applications, it is acceptable to add some inert gases, especially helium, in some or all steps which, in some cases, may be in even greater flow rates than the hydrogen. It is also acceptable, and may be helpful in many applications to add small amounts of oxygen, nitrogen and/or fluorine containing gases so that the total of the concentrations in the plasma of oxygen, nitrogen and fluorine may be up to about 20% of that of hydrogen. The purposes for adding small amounts of such gases include enhancement of removal of PR or residues, as well as avoidance of etching, damage to or oxidation of the exposed sensitive surfaces. These surfaces are parts of the transistors that are being fabricated and may consist of silicon or silicon compounds including silicon dioxide or metal silicides. Oxygen or nitrogen containing gas additives, when included with the substantially larger amount of hydrogen in the gas mixture, substantially prevent etching or reduction of silicon oxide or other sensitive dielectrics that may be used as a protective layer on the wafer surface. Such additives may also substantially prevent the etching of exposed silicon that will become parts of the transistor.

The stripping and residue removal processes may or may not use ion bombardment or high wafer temperature to promote the stripping or removal reactions in any or all steps. In particular, the plasma generation may use any of the well-known types of plasma sources such as microwave, inductively coupled or capacitively coupled. Generally, the disclosed stripping and residue removal processes may be done over a wide range of gas pressures, extending from about 2 mTorr to as much as about 5 Torr. The total flow of gas provided for the process may vary from about 50 standard cubic centimeters per minute to as much as about 20 thousand standard cubic centimeters per minute. The power provided to the plasma source may generally vary between about one hundred Watts to as much as about 5 kiloWatts. Wafer temperature may be from room temperature up to about 350 degrees Celsius. Some step(s) in stripping resist or removing residues may also use ion bombardment of modest energy (generally less than about 100 eV per ion) to promote chemical reactions for stripping or residue conversion. Power provided to energize ions, in the event that ion bombardment is to be used, may vary between about 10 Watts to as much as about 1000 Watts for 300 mm size wafers, depending on the gas pressure and the amount of power used to generate the plasma.

The principal applications for this invention are the PR stripping and residue removal following three important steps in the making of transistors on the wafer, as follows.
1. High dose ion (HDI) implantation to form ultra-shallow junctions. These implants are the so-called source/drain "extension" implants and the source/drain implants.
2. Polysilicon or metal etching to pattern the gate electrode of the transistors.
3. Contact etching of holes, in the first permanent thick layer of insulation on the wafer, to allow connection to the source and drain of the transistor and the gate electrode.

Process Gas Composition Not Depending on Application

In all embodiments of this invention, hydrogen gas is the dominant reactive gas that is injected into the plasma source, and may in many cases may be mixed with inert gas or small amounts of reactive additives such as oxygen or nitrogen containing gases. The exact proportions of other gases in the gas mixtures that may be used for embodiments of the invention will depend on both the total gas pressure, and whether power is used to provide bombarding energy to ions. We have found that the admixture of very small amounts—in many cases several percent or less—of oxygen, or nitrogen containing gases to the hydrogen substantially improves the processing rate and the cleanliness of the wafer after stripping. This beneficial effect is seen in many applications across a wide range of process pressures and independent of whether ion bombardment is a significant process feature. Further, embodiments of this invention, in addition to improved efficiency and effectiveness of cleaning, have been found to better preserve the silicon and silicon-based layers that are part of the transistors. This result produces great benefits in IC production by significantly reducing IC cost and improving IC performance and reliability.

There are two principal embodiments of our hydrogen-based stripping process, depending on whether the stripping or residue removal requires ion bombardment or not. For the most part, the applications requiring ion bombardment will need such ion energy because they are best done at relatively low temperatures (less than or about 120 Celsius). In some cases, ion activated processes may also require higher wafer temperatures. Non-ion-activated processes—typically done downstream from a plasma radical source—usually require higher wafer temperatures. Each of these two alternative modes of stripping has its own separate set of preferred gas mixtures or recipes. Typically, PR stripping applications following etching steps may be less sensitive to wafer temperature and therefore adequately addressed by one embodiment of the invention, a non ion-based, higher temperature (>200 Celsius) process. A second embodiment has the activation energy for stripping and/or residue removal supplied (at least in substantial part) by ions coming from the gas phase above the wafer. Applications such as the removal of heavily ion implanted PR will sometimes require lower wafer temperature, at least for the beginning of PR stripping.

In general, the higher temperature stripping process steps (temperatures between about 120 Celsius and 300 Celsius) will be done at higher gas pressures, resulting in higher fluxes of neutral reactive species to the wafer. These processes involve etching based on surface chemistry of neutral species. Such processes proceed substantially without need for charged species from the plasma that have more than about 10 to 15 electron Volts of energy. Therefore, they cannot cause loss of silicon by sputtering of the exposed surface. This mode uses processes that may typically contain higher percentages of heavier gas constituents.

In any step in an application where energized ion bombardment is not used, embodiments of the invention may include having the hydrogen gas or mixture contain large amounts of inert gases, including heavier ones such as argon for dilution, up to several times the flow of hydrogen. In other cases where ion bombardment occurs in the particular process step, embodiments of the invention may use only small amounts of gases that would produce heavier ions. However, heavier inert gases (such as Argon) must be kept to very low concentrations, particularly for total process gas pressures less than about two hundred milliTorr, in order to minimize material loss due to sputtering. In all cases, substantial flows of helium, up to several times that of the hydrogen, may still be used since it is very light and largely not ionized in most processing plasmas.

The proportions of other reactive gases that may be used in embodiments of the invention also depend on the gas pressure and whether energetic ion bombardment occurs in that step in any stripping process. If the plasma source is remote from the wafer, embodiments of the invention may have a combined concentration of oxygen, nitrogen and fluorine up to about 20% of the hydrogen concentration. This same concentration limit for other gases also applies in situations where the plasma in the source is adjacent to the wafer but ion energies are less than about 20 eV, which is the minimum energy for which substantial ion sputtering of the wafer surface material occurs. (Such a situation may occur when a low pressure plasma is adjacent to the wafer but ions are not accelerated to the wafer by a separate RF power source connected to the wafer support structure.) Embodiments of the invention have the same limit for combined oxygen, fluorine and nitrogen concentrations when the total gas pressure is sufficiently high relative to the amount of power supplied to energize ions striking the wafer. In this last case, it is the ratio of ion accelerating power per unit area of the wafer to the total gas pressure that determines whether ion energies are so low that sputtering will not occur. In general, when the ratio of power density in Watts per centimeter squared to gas pressure in Torr is less than or about 0.3 there is little, if any, silicon sputtering and the 10% limit pertains to total oxygen, fluorine and nitrogen concentration.

Limits for flow rates of different types of additive gases that may be used in the target processes may be specified. The total flow for all oxygen-containing gases, if no other additive gases are used, should never be more than about 15% of the hydrogen flow rate. For oxygen gas ($O_2$), if it is the sole source of other reactive gas, this proportion should not exceed about 10% of the hydrogen flow. Water vapor ($H_2O$) flow, however, may be as much as about 15% of the hydrogen flow if it is the sole reactive additive gas. The total flow of fluorine containing gases should generally be less than five percent of the hydrogen flow since atomic fluorine is likely to promote chemical etching at higher concentrations, even with predominantly hydrogen in the processing ambient. The total flow of Nitrogen containing gases may generally be up to about 20% that of hydrogen. In particular, if $N_2$ is the sole additive gas in a given step, its flow may be up to about 20% of the hydrogen flow. If NH3 is the sole nitrogen-containing gas, its flow may also be up to about 20% of the hydrogen gas flow. If a gas such as $N_2O$ is used, it may have up to about 10% of the hydrogen flow rate.

Specific gases that could serve as sources of the other reactive species may include: oxygen, ozone, water vapor, carbon dioxide, alcohols, nitrogen, nitrogen oxides, ammonia, Fluorine gas, carbon tetrafluoride, nitrogen trifluoride, sulfur hexafluoride, hexafluoroethane. Other common gaseous sources of oxygen, nitrogen and fluorine that do not also contain depositing species such as silicon, arsenic, boron or phosphorus may be used.

For any step in a process where slightly energetic (between about 30 eV and 50 eV) ion bombardment occurs, the mixture of gases should use reduced concentrations of heavy noble gases, oxygen, nitrogen or fluorine containing gases to avoid unacceptable surface material loss. The combined concentrations of heavy noble gases, oxygen, nitrogen or fluorine in general should be less than or about 10% that of hydrogen. In specific applications where hydrogen is used with less than or about a few percent of noble gas or other reactive species, the ion energy may be about 100 eV or less. The maximum total and partial flows of various additive gases in these circumstances may be calculated by scaling proportionally from the maximum flows allowed for the non ion-bombarding case listed above.

Other Characteristics of the Disclosed Stripping Processes not Specific to a Single Application Process conditions other than gas flows for the various embodiments of the disclosed invention include:

Process gas pressures may be between about 2 milliTorr and about 5 Torr with the lower process pressures—under about 100 mT—generally involving lower total gas flow rates. Thus, at pressures from about 2 mT to about 50 mT, total gas flows may typically be in the range of about 50 Standard cubic centimeters per minute Sccm) to as much as a few standard liters per minute (Slpm). At pressures above several hundred milliTorr, the gas flow is generally greater than or equal to 100 Sccm but less than about 20 Slpm. At intermediate pressures (50 mT to about 400 mT), the total flow may be in the range from about 50 Sccm to as much as about 10 Slpm.

The power provided to plasma sources such as microwave or inductive types to produce reactive species—may be in the range from about 50 Watts to as much as about 5 kW. The power level for inductive plasma sources may be largely over the stated range for the entire range of pressures or flows. Power levels for microwave sources may be in the same range but use of higher power levels (>3 kW) requires larger volume sources—a liter or more—than the classic 1" tube—through a 2.45 GHz waveguide.

The range of power for embodiments of the invention using capacitively coupled RF—whether for enhancing ion energy or generating the plasma—should be strictly limited depending on the gas pressure and the type of source. The limit will be a function of the gas pressure and the ion flux generated by the plasma source. For plasma sources using almost pure hydrogen and generating very high ion fluxes—exceeding 10 milliAmps per square centimeter—biasing power may be up to several hundred Watts for a 200 mm Wafer and proportionally higher for larger wafers.

Use of larger amounts of heavier gases reduces the maximum power allowable substantially—certainly to less than 100 Watts and perhaps even below 50 Watts for a 200 mm Wafer. When ion current densities are reduced, which is the case when the gas pressure is higher or plasma source power is lower, the power used to provide ion energy needs to be reduced proportionately.

Normal capacitive discharges at pressures less than or about 100 mTorr, even when limited to very low power density—less than or about 0.05 Watts per square centimeter which is about 35 Watts power for a 300 mm wafer—may not have sufficiently low ion energy to avoid substantial sputtering. Discharges with hollow cathode configurations are able to sustain at much lower voltages for a given power density and therefore are suitable for embodiments of the invention. However, in general, the ratio of the RF power to the wafer area in Watts per centimeter squared divided by the gas pressure in Torr should be less than or about 0.5. This low value for gas pressures typically of one Torr or higher ensures that ion damage to the sensitive areas is within specified limits.

The total gas flow rate should be sufficient to provide for acceptable PR stripping or residue removal rates. For PR stripping, removal rates of several microns per minute have required reactive gas flows up to as much as about 20 of gas per minute. Such high rates will not normally be needed in the future for the relevant applications so that total reactive gas flow rates of about 100 SCCM to as much as about 10,000 SCCM should include all normal processes. When the addition of inert diluents is included (since other reactive added gases have relatively small flows) the total might be as high as about 20,000 to even 30,000 SCCM. For steps where very small amounts of material are removed, such as for post-strip residues, the total flows may be smaller. In such steps, total flows may be as low as several tens of SCCM and as much as about 10,000 SCCM. Use of large amounts of inert gas may be helpful in cases where slowing the process is desirable but in general it is not needed.

General Mechanism of Disclosed Stripping and Residue Removal Processes and of the Prevention of Oxidation or Etching of the Critical Silicon-Containing Surfaces Any step in the stripping and/or residue removal applications appropriate for this invention may have the plasma source adjacent to the wafer or remote from it. With the plasma source adjacent to the wafer, there may be a separate source of power provided to energize the ions. In any of the above configurations, hydrogen, while less reactive with carbon or hydrocarbon polymers than oxygen, can still (when fed into a plasma-source based stripping system) remove most PR polymers at rates that may be acceptable for IC production, depending on the previous treatments of the PR. Addition of small amounts of oxygen or nitrogen containing gas(es) to the hydrogen increases this etching rate, and usually significantly, without also causing damage to, or oxidation of, the exposed silicon in sensitive areas of the transistor. This is because the oxygen or nitrogen atoms are substantially more reactive with carbon than are hydrogen atoms. In some cases, the oxygen or nitrogen atoms may act effectively like activators for reactions with the PR by hydrogen since these atoms are much more capable of reacting with the middle of a PR polymer chain than is hydrogen. Once the polymer chain is broken, it is easier for the hydrogen to react with the dangling ends of the polymer. Small amounts of oxygen, therefore, may have disproportionate (to its concentration), beneficial effects on overall stripping rate of the PR. Furthermore, nitrogen atoms or oxygen atoms react exothermically with carbon chains to form the tightly bonded species, CN or CO, respectively.

When energetic ion bombardment is used for the desired applications, it is important to avoid both sputtering or reactive ion etching of exposed silicon containing layers. Use of predominantly hydrogen gas and limiting ion energies to less than about 100 eV greatly reduces sputtering caused by ions. However, having gas feed of pure hydrogen could result in reactive ion etching of the exposed silicon or silicon oxide due to the presence of large amounts of adsorbed hydrogen atoms on the wafer surface. Such hydrogen atoms react with the silicon to form $SiH_4$ which is volatile and with $SiO_2$ to form water vapor and $SiH_4$. While not intending to be limited by theory at any point in this disclosure, it is thought that the presence of very small amounts of oxidizing species such as oxygen atoms or nitrogen avoids hydrogen etching by reacting with the $SiH_n$ before full saturation, forming either NH, $NH_2$, OH or $H_2O$ and leaving the Si un-hydrated or less saturated by hydrogen. It is also possible that SiO or SiN may form when nitrogen or oxygen are present, however, due to the higher flux of hydrogen atoms, these will rapidly be reduced to Si again (by exothermic reactions) with the products Si and OH or NH radicals. Because of the much higher reactivity of the oxygen or nitrogen atoms with silicon, it is important to have much smaller amounts of oxygen or nitrogen containing gases added to the predominantly hydrogen gas mixture to avoid formation of $SiO_2$ or $Si_3N_4$. Furthermore, due to the potential for sputtering by oxygen or nitrogen ions on silicon, it is important to hold the oxygen or nitrogen containing gas additives to the percentages specified above so as to keep sputter loss of silicon to acceptable levels. Noble gas ions are capable of sputtering silicon and therefore must be kept to a very small fraction of the ions in the plasma. In the case of helium, since its ionization potential is so high, very few atoms are ionized in the plasmas even when helium has the highest partial pressure. Therefore, partial pressures of heavier noble gases must be kept to small percentages of the total whereas helium gas may have up to several times the partial pressure of the hydrogen.

Chemical reactions on the surface of the wafer are mostly the same whether or not there is ion bombardment: in the first instance, hydrogen atoms reacting with silicon, silicon oxide or silicon nitride to form silicon hydrides, or silicon and OH or NH radicals. Secondly, oxygen or nitrogen atoms reacting with silicon atoms in the crystal that may or may not have some hydrogen atoms bonded to them to form silicon and OH or NH radicals, SiO or SiN. Chemical reactions in this case may have activation energy provided by wafer temperature, by energetic photons from the plasma—if it is adjacent to the wafer—and by electron or soft ion bombardment. In effect, the silicon surface acts as a catalyst for the formation of OH, $H_2O$, NH or $NH_2$ from the hydrogen and oxygen or nitrogen atoms in the gas phase.

In addition to the desired stripping action, there are also possible undesirable results of the hydrogen exposure—mainly the etching of silicon—that need to be avoided. There are well known chemical reactions of the hydrogen atoms with silicon that produce silane ($SiH_4$) a volatile compound causing silicon loss from the surface. However, the first step in this reaction, formation of SiH from crystal silicon and hydrogen atoms, is endothermic (~109 kJoules/mole based on JANAF Thermo-chemical Tables—National Bureau of Standards, 1986).

Yet, for the applications of interest, it is highly undesirable to form or increase the thickness of a layer of $SiO_2$ on the surface of the silicon wafer. It is necessary therefore to have a much higher flux of hydrogen atoms to the surface so that the silicon monoxide cannot further react with oxygen or OH to form $SiO_2$. Once silicon dioxide is formed, it is more stable against reduction by hydrogen and may result in eventual growth of a thicker layer that costs precious silicon. The silicon dioxide does not form when the flux of hydrogen is sufficiently dominant, since the reaction of atomic hydrogen with SiO is exothermic (~30 kJoules/mole) forming silicon and hydroxyl radicals. The admixture of the proper small amount of oxygen or oxygen containing gas(es) or nitrogen/nitrogen containing gases in the mainly hydrogen gas provides for a balance between reduction of the silicon by hydrogen and abstraction of the hydrogen by hydroxyl radicals, oxygen atoms, nitrogen atoms or NH radicals that preserves the silicon. In effect, there is an equilibrium steady state of the silicon surface wherein the oxygen and/or nitrogen and hydrogen are constantly reacting with silicon and silicon bonded with one or the other. Each of the reactant hydrogen atoms or oxygen containing radicals providing protection against oxidation, nitridation or etching of the silicon.

EMBODIMENTS OF THE INVENTION FOR PARTICULAR APPLICATIONS

Stripping of Ion Implanted PR

The removal of resist and residues following high dose ion implantation is probably the most challenging of the three targeted applications because of the difficulty of removal of the carbonized crust and post-strip residues, as well as the need to avoid even slight damage, etching or oxidation of the silicon. The resist in this application is particularly difficult to remove due to the silicon sputtered onto the sidewalls of the PR, as well as the hard crust on the surface caused by the ions depositing energy in it during ion implantation. Processes for this application may be one or more steps, but multistep processes are generally superior at producing clean wafers since they can be better adjusted to differences in the types of layers to be removed. In the disclosed invention, all steps use mainly hydrogen-based mixtures with small admixture of oxygen or nitrogen or other oxygen or nitrogen-containing gases for HDI implanted PR stripping. Use of this invention in advanced IC production will result in less silicon (and dopant) loss and oxidation at the transistor junctions on the wafer surface, leading to superior integrated circuit performance.

For single step stripping processes, there are two alternative approaches. The first alternative embodiment of the invention provides for heating the wafer to a temperature of about 175 Celsius to about 350 Celsius and subjecting the wafer to a stream of radicals from a plasma source that may be remote or adjacent to the wafer. In either case, there is no electrical potential provided to any structure (pedestal, pins or otherwise) upon which the wafer is supported. The high temperature causes the PR, including the crust, to react chemically with the reactive radicals in the gas stream. Typically, there will be very little residue remaining on the wafer following such a process. If desired, such residues as remain may be removed by wet chemical treatment. One exemplary single step embodiment of the invention is as follows:

- It uses a wafer temperature between 200 Celsius and 275 Celsius
- It provides a flow of hydrogen gas between 500 SCCM and 4000 SCCM.

It provides for a flow of unreactive gas (helium or argon) of less than or about 4000 SCCM.

It provides a flow of oxygen gas of between 5 SCCM and 80 SCCM.

It provides a total gas pressure of between 5 milli-Torr and 1500 milli-Torr.

It provides for power supplied to the plasma radical source of between about 100 Watts and about 3000 Watts.

It provides for a wafer handling system that has a double vacuum load lock to minimize the danger of hydrogen gas release.

For process embodiments of multi-step stripping of implanted PR, there may be two or more total steps, and multiple alternatives for initial and all following steps, different combinations of which may be utilized. The first step may be for etching the crust, for etching both crust and bulk PR, or for just removing the silicon that has been sputtered onto the sidewalls of the PR mask. The last step is usually for removing the residues remaining after most or all of the crust and bulk have been removed.

In cases where the first step uses a non-ion bombarding, downstream configuration with the wafer at elevated temperature (at least about 175 Celsius), it may use a gas mixture having hydrogen as principal reactive gas with flow rate between about 200 SCCM and 20000 SCCM. Oxygen flow may be between about 0.1% and about 5% of the hydrogen flow rate with inert gas (helium or argon) flow between half to twice as much as that of hydrogen. Less than about 3% fluorinated gas may be added to the flow. The total gas pressure in the process region may be between about 10 mTorr and 5 Torr. In this first stripping step, the crust and the bulk PR are both etched due to the combined effects of reactive radical and elevated wafer temperature, leaving only modest residues on the surface of the wafer.

In another alternative embodiment of the invention, the initial step may be to remove silicon from the surface of the PR or that and the crust only. It may be performed in a chamber configured so that the wafer is at lower temperature (<120 Celsius) with a low-pressure plasma (between about 3 mTorr and about 50 mTorr) being adjacent to the wafer. The flow rate of hydrogen may be between about 20 SCCM and about 2000 SCCM. The total flow of additive gases containing oxygen or nitrogen may be between about 0.2 SCCM and about 100 SCCM. There may or may not be a separate source of power to increase the energy of ions bombarding the wafer. In this case, modest energy ion, photon and electron bombardment activates chemical reactions of radicals with either the silicon on the sidewalls of the PR and/or the ion-implanted crust on the surface of the PR.

In one embodiment of the invention, a second step to remove non-implanted PR, which can be used in combination with the preceding first step, may be done at higher wafer temperature (>150 Celsius) and gas pressure (>100 mTorr), and may use higher flows of hydrogen (between about 200 SCCM and 20000 SCCM) and flows of additive gases containing oxygen, nitrogen and/or fluorine—less than about 10% that of hydrogen. If Nitrogen gas is used, it may comprise up to about 20% of the hydrogen gas flow. This higher limit for nitrogen is generally due to its low degree of dissociation in the plasma and lower reactivity with silicon which means that its chemical participation is much reduced compared with oxygen at the same concentration. Typically, power to the plasma source may be greater for this step than the preceding step, being in the range between about 300 Watts and about 5000 Watts. A particular example of conditions for this process step may be: Wafer temperature=250 Celsius; Gas pressure=0.6 Torr; Hydrogen Flow of 3000 SCCM; Oxygen flow of 60 SCCM and RF power to the plasma source of 2700 Watts. A second particular example of conditions for this process step may be: Wafer temperature=250 Celsius; Gas pressure=1.0 Torr; Hydrogen Flow of 4000 SCCM; Nitrogen gas flow of 400 SCCM and RF power to the plasma source of 1500 Watts.

A final step may then remove the residues remaining on the surface of the wafers following the first step or steps. Such a final step might be done over a wide range of wafer temperatures (between about 20 Celsius and about 350 Celsius) and a wide range of gas pressures (between about 3 mTorr and 5 Torr). It may include ion bombardment at modest energy from a plasma source adjacent to the wafer where there may or may not be an independent source of power to provide additional energy to ions striking the wafer. The additional power to the ions might be in the range of about 10 Watts to a 200 mm wafer at low pressures (less than about 150 mTorr) to as much as about 1 kW for a 200 mm wafer at higher gas pressures. For low gas pressures (<10 mTorr), the additional wafer power in units of Watts per centimeter squared should not exceed about 0.5. At higher pressures (>0.3 Torr) the ratio of additional power (in Watts/cm$^2$) to the gas pressure (in Torr) should not exceed about 1.0. The flow of hydrogen generally depends on the pressure regime. In an alternative embodiment with pressure less than about 20 mTorr the flow of hydrogen may be between about 20 SCCM and about 2000 SCCM. The oxygen or nitrogen flow in this pressure regime may be between about 0.1 SCCM and about 100 SCCM. Generally the combined flows of oxygen and nitrogen containing gases should be less than about 10% of the hydrogen flow rate. If fluorine is used, its flow rate may be less than about 2% of the hydrogen flow rate.

One particular embodiment of the invention employs two process steps including a first step having the wafer separated downstream from a plasma source, and a second step with the wafer adjacent to the plasma and being bombarded by ions. The first step removes virtually all of the crust and the bulk PR while the second removes the residues. In the first step, the wafer is subjected to reactive radicals from a hydrogen-based gas mixture as it is gradually increased in temperature from room temperature to more than 200 Celsius over a time of between 30 seconds and about 5 minutes. The gas composition is between 95% and 98% hydrogen with the remainder being oxygen gas. The gas pressure is between about 0.5 Torr and 1.2 Torr. The plasma source uses RF power in the range between about 500 Watts and 3 kilowatts. In the second step, with the wafer adjacent to the plasma, the gas pressure is between about 3 mTorr and 20 mTorr. The gas composition is between 98% and 100% hydrogen with the remainder, if any, being oxygen gas. The RF power to the plasma source—which may be an inductively coupled plasma source—is at between about 700 Watts and 2000 Watts. Additional RF power may be used to increase ion energies and can be up to about 100 Watts for a 200 mm wafer. In this step, the wafer is kept to temperatures below about 150 Celsius for a total time between about 15 seconds and as much as about 3 minutes.

Some embodiments of the invention may use a very small amount (typically less than or about a few percent) of fluorine as an additive in any of the steps including crust removal, bulk resist strip or residue removal. Normally, such fluorine might cause unacceptable silicon or silicon oxide loss due to etching. However, the presence of so much hydrogen tends to de-activate the fluorine by causing fluorine to be tied up as HF gas.

Stripping Following the Patterning of the Gate Electrode

The purpose of the process for this application is to completely remove all organic PR and inorganic residues remaining after the etching process that patterns the gate electrode. This process may be done in either single or multiple steps. The gate electrode patterning process may or may not use a hard-mask that is patterned prior to beginning etching of the gate electrode material. Such a hard-mask can use carbon polymer, metal or another material that is more resistant to isotropic etching than is PR. The PR may be stripped after patterning but prior to using the hardmask while etching to pattern the gate electrode. If so, the PR strip may not require special process chemistry such as we disclose. In some cases (such as a carbon polymer hardmask), the removal of the hardmask may be done with a similar approach to PR stripping. Following etching with any type of hardmask, there will be residues remaining which incorporate elements from the hardmask. In case the hardmask is carbon-based, the residues may be similar to those found following gate patterning using PR masking. In this case (and some others), hardmask stripping and residue removal may be beneficially done with our invention. The basic feature of preferred embodiments of this invention is the use of predominantly hydrogen gas as the source of reactive species for stripping and residue removal. The gas used may also include oxygen or nitrogen containing gases in small amounts and/or fluorine in very small amounts. Critical to the success of this process is minimizing the amount of oxidation or loss of the side-walls of the newly patterned gate electrodes.

In some cases, PR using polymers containing fluorine may be used in the future for patterning gate electrodes. Further, since the etching of the gate material uses halogenated gases (typically chlorine and bromine containing gases), the residues remaining on the sidewall of the gate electrodes will contain such halogens as well. The high hydrogen content in the gas feed for the disclosed invention minimizes the release of free halogen gas atoms into the process chamber ambient that could cause etching of exposed polysilicon or metal surfaces. This is due to the high affinity of hydrogen for such halogens. Such halogens come from two sources: first the residues which are left on PR and sidewalls of the gate electrodes by the polysilicon etching process; secondly, which come from the fluorine in the polymer of advanced photoresists. It also greatly reduces sidewall silicon oxidation during stripping. This reduces the total amount of sidewall silicon loss, resulting in more consistent transistor characteristics and increased IC yields.

Such stripping processes, as performed by embodiments of the invention, are usually one or two steps. For a single step process done at higher gas pressures or without energetic ion bombardment, one may use gas mixtures having substantial noble gas diluents and up to about 10% oxygen or nitrogen containing gases, resulting in less silicon loss or oxidation on the side-wall of the gate electrode. Noble gas additives, in this case, may be as much as about three times the flow of hydrogen. The total flow of gas may be from about 100 standard cubic centimeters per minute to as much as about ten standard liters per minute. The process pressure may be from about a few millitorr to as much as about 30 Torr. The wafer temperature during the process may be from about room temperature to as much as about 350 Celsius. The RF power provided to the plasma source may be from about 100 Watts to as much as about 3 KiloWatts. For lower pressure (less than about 100 mT) stripping processes in which ion bombardment is used in either the first or a later step, the concentrations of either inert gas or reactive additive must be reduced. Inert gas recipes using helium can have up to 50% as much helium as hydrogen while heavier inert gases should be less than about 10%. Flows of either a nitrogen or oxygen containing gas or a combination should be less than about 5% of the hydrogen flow.

In two step processes that are embodiments of the disclosed invention, the first step normally removes the bulk of the PR and the second removes residues that commonly contain silicon and halogen atoms. In most embodiments of our invention, the first step is done in a configuration where the plasma source is separated from the wafer. One embodiment of the disclosed invention uses a first step having a gas mixture that is between 98% hydrogen and 99.5% hydrogen with the remainder being oxygen gas. An alternative embodiment uses a gas mixture having between 90% and 98% hydrogen with the remainder being nitrogen gas. In both these cases, the wafer is typically raised to at least 150 degrees Celsius during the first process step which may last between about 20 seconds and 2 minutes. The gas pressure in the wafer process region is between about 300 mTorr and about 1.5 Torr. The RF power used for the plasma source may be in the range between about 300 Watts and about 3 kilowatts. The second step may be done in either a downstream configuration or where the wafer is adjacent to the plasma source. In the former case, the wafer temperature may be up to about 250 Celsius with the gas mixture including at least 99% hydrogen gas and a combined flow of less than one percent of reactive additive gases containing oxygen, nitrogen or fluorine. In the latter case, having ion flux to the wafer, there may be a small amount of RF power applied to the wafer holding pedestal so that ion bombardment helps to break-up the inorganic residues remaining after the PR or hardmask has been substantially removed. In most embodiments of the invention, gas mixtures generally have almost entirely hydrogen but may also contain up to a few percent of additive gases. Very small amounts of fluorine may also be used—typically less than or about 1% of the hydrogen flow. Power provided for increasing ion energies may be up to about 0.3 Watts per centimeter squared of wafer surface. The gas pressure in this case is typically between about 5 milliTorr and up to about 5 Torr with the amount of biasing power depending on the pressure.

One reason hydrogen-based processes have not been well accepted for this application is that the atomic hydrogen may generate interface states at the interface of the gate dielectric with the substrate silicon. Recently it has been found that the simple forming gas anneal at moderate temperature (450 Celsius to 650 Celsius) is adequate to passivate such interface states and restore the gate to proper function.

Stripping Following Contact Hole Etching

The primary purpose of the stripping and residue removal is to completely remove all organic PR and inorganic residues remaining after the dielectric etching process that creates holes through which connections will be made to the source/drain and gate of the transistor. This stripping process may be done in either single or multiple steps, and may be done in the same chamber used to do all or part of the etching process, or in a separate chamber or chambers. Following etching, there will be both PR and residues remaining that incorporate material from the PR and the silicon dioxide or silicon nitride that have been etched. The basic feature of preferred embodiments of this invention is the use of hydrogen gas as the predominant source of reactive species for stripping and residue removal. The process gas mixture for any step may also include oxygen or nitrogen containing gases in small amounts and/or fluorine in very small amounts. This provides a superior process to the currently used stripping process—which employs oxygen gas—because it greatly reduces the loss of material or conductivity of the surface layer of silicide at the transistor junctions.

Loss of, oxidation of, or damage to the silicide can be caused by more than one mechanism. First, the fluorine contained in the sidewall residues on the dielectric being liberated during a prior art oxygen based strip following the contact etch could damage the silicide. Second, residue removal of hardened silicon oxide-containing residues requires fluorine that may damage the silicide. Finally, the oxygen used in prior art oxygen-based stripping can oxidize the silicide. The use of the gas chemistry of the disclosed invention for stripping prevents the oxidation and hardening of the silicon containing residues on the sidewall of the contact hole due to the etching. Use of small amounts of oxygen or nitrogen additives does not significantly harden such post-etch residues, nor do they oxidize the silicide. However, in embodiments of the invention using oxygen or nitrogen containing additives, the use of such gas additives, even in such small amounts, substantially increases the removal rate and effectiveness of the process. Use of the disclosed stripping process may even eliminate, in some cases, the need for a post-strip residue removal step because of the avoidance of oxidation. In the event a residue removal step is used, it need not use much, if any, fluorine because hydrogen alone is capable of breaking down or removing silicon containing residues.

Such stripping processes, as embodiments of the invention, are usually one or two steps. Often, a single step process is done to remove substantially the organic PR while the residues then are removed in a wet chemical bath. Typically, in a two-step process, the first step is to remove the PR polymer while the second is to remove the silicon-containing residues. For a single step process done at higher gas pressures or without energetic ion bombardment, one may use gas mixtures having substantial noble gas diluents and up to about 10% oxygen or nitrogen containing gases. Noble gas additives in this case may be as much as about three times the flow of hydrogen. This results in less oxidation of the very sensitive silicide (typically nickel silicide in the future) that forms the junctions of the transistors. It is noted that the nickel silicide may be of a thickness in a range from approximately 120 Angstroms to approximately 230 Angstroms with decreasing thickness in successive technology nodes. The total flow of gas may be from about 50 standard cubic centimeters per minute to as much as about ten standard liters per minute. The process pressure may be from about a few millitorr to as much as about 30 Torr. This pressure would pertain to a capacitively coupled type of stripping chamber. The wafer temperature during the process may be from about room temperature to as much as about 350 Celsius. The RF power provided to the plasma source may be from about 100 Watts to as much as about 3 KiloWatts. For lower pressure (less than about 100 mT) stripping processes in which ion bombardment is used in either the first or a later step, the concentrations of either inert gas or reactive additive must be reduced. Inert gas recipes using helium can have up to 50% as much of it as hydrogen while heavier inert gases should be less than about 10%. Flows of either a nitrogen or oxygen containing gas or a combination should be less than about 5% of the hydrogen flow.

In two step processes that are embodiments of the disclosed invention, the first step normally removes the bulk of the PR and the second removes residues that commonly contain silicon and halogen atoms. In most embodiments of our invention, the first step is done in a configuration where the plasma source is separated from the wafer. One embodiment of the disclosed invention uses a first step having a gas mixture that is between 98% hydrogen and 99.5% hydrogen with the remainder being oxygen gas. An alternative embodiment uses a gas mixture having between 90% and 98% hydrogen with the remainder being nitrogen gas. In both these cases, the wafer temperature is typically raised to at least 150 degrees Celsius during the first process step which may last between about 20 seconds and 2 minutes. The gas pressure in the wafer process region is between about 300 mTorr and about 1.5 Torr. The RF power used for the plasma source may be in the range between about 300 Watts and about 3 kilowatts. The second step may be done in either a downstream configuration or where the wafer is adjacent to the plasma generated within the source. In the latter case, the wafer temperature may be up to about 250 Celsius with the gas mixture including at least 99% hydrogen gas and a combined flow of less than one percent of reactive additive gases containing oxygen, nitrogen or fluorine. Also in this case, having ion flux to the wafer, there may be a small amount of RF power applied to the wafer holding pedestal so that ion bombardment helps to break-up the inorganic residues remaining after the PR or hardmask has been substantially removed. In most embodiments of the invention, gas mixtures generally are made up almost entirely of hydrogen but may also contain up to a few percent of additive gases. Very small amounts of fluorine may also be used—typically less than or about 1% of the hydrogen flow. Power provided for increasing ion energies may be up to about 0.3 Watts per centimeter squared of wafer surface. The gas pressure in this case is typically between about 5 milliTorr and up to about 5 Torr, with the amount of biasing power depending on the pressure.

Apparatus for Stripping PR with Hydrogen-Based Processes

In general, stripping chamber(s) consisting of plasma source plus process chamber are part(s) of an automated PR stripping system including a robotic wafer handling system. In some cases, current wafer handling systems for stripping chambers may use a single stage vacuum load lock for wafers prior to inserting them into the vacuum chamber used for stripping. Non loadlocked systems can easily release any remaining hydrogen gas in the process chamber into the environment and therefore they may not be used for stripping processes employing large flows of hydrogen gas. Single load-lock systems make processing with substantial amounts of hydrogen gas somewhat safer since they prevent very much hydrogen leakage that may lead to accumulation at atmospheric pressure that could lead to explosions. However, even with these, there can still be release of small amounts of hydrogen from such a system because the load lock alternately cycles to and from atmospheric pressure.

Figure 7:
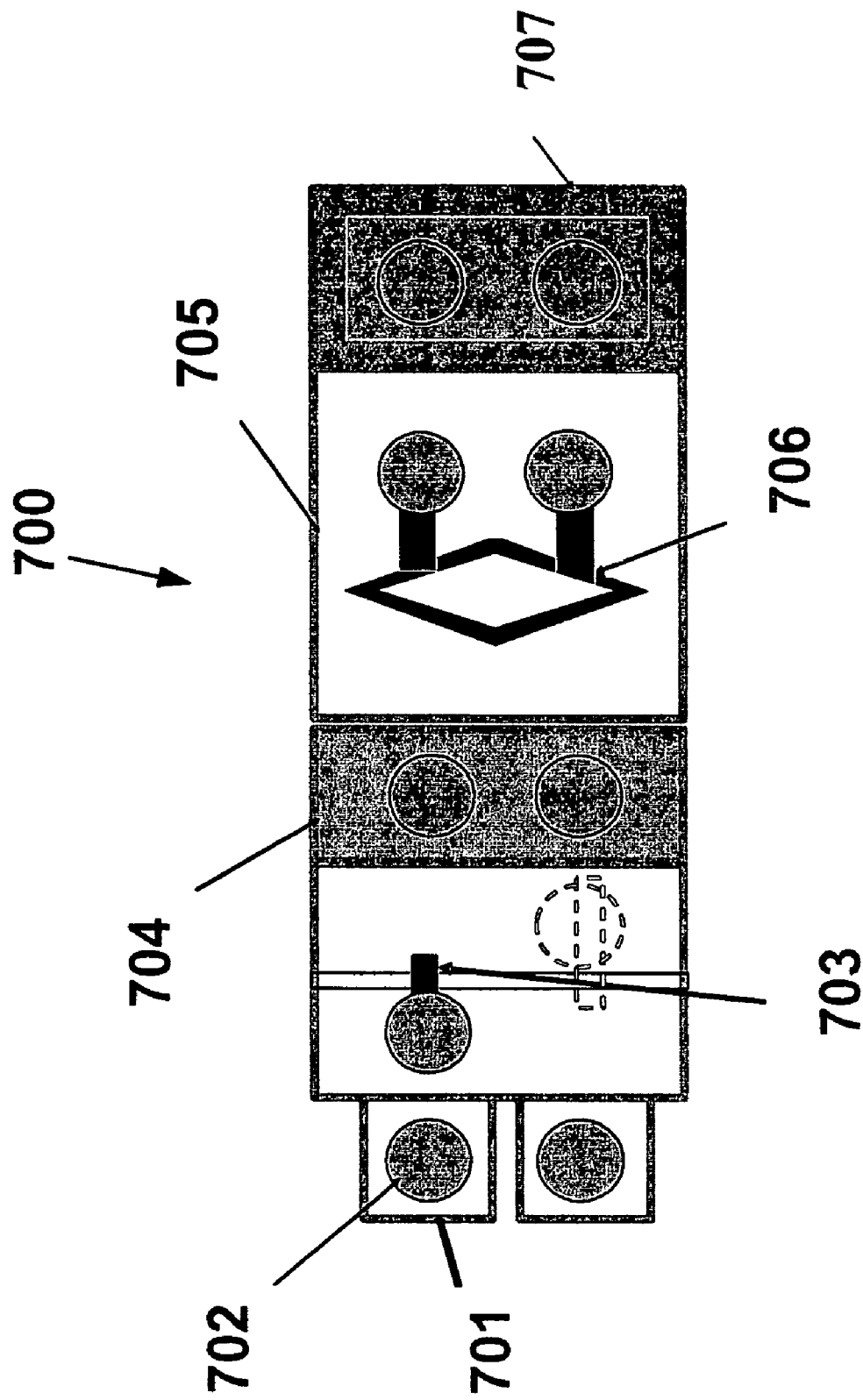
FIG. 7 is a diagrammatic plan view of a stripping system having two separate vacuum chambers that wafers must pass through on their way to a processing chamber, thereby providing superior isolation from the factory environment of flammable hydrogen gas or other hazardous gases that may be used in the process.

Referring to FIG. 7, one embodiment of a superior wafer processing apparatus, generally indicated by the reference number 700, for the stripping applications addressed herein employs a double load-locked wafer handling system. Such a system permits the safe use of gas mixtures high in hydrogen gas. Double load-locks provide an extra margin of safety for the multi-billion dollar IC Fabrication facilities. In such a stripping system the wafers are supplied for processing and returned from processing in cassettes or FOUPS (the current term in IC manufacture for a closed pod that holds wafers) placed on load ports 701. Wafers 702 from the cassettes/FOUPS are moved by an automated handling robot 703 into a first vacuum load lock 704 which can hold two wafers or more. The first load lock is evacuated and the door to a second load lock 705 is then opened. From the shelves of first load lock 704, the wafer is brought into second load-locked chamber 705 by a vacuum robot 706. The door to the processing chamber is opened to remove a previously processed wafer and permit loading of a new wafer. The wafer to be processed is then moved into a processing chamber 707, where the door is closed and the wafer is processed. The processed or completed wafer is then returned from the processing chamber to the second load-lock by the same vacuum robot and placed into the first load lock when it is under vacuum. That first load lock 704 is then re-pressurized to atmospheric pressure and wafers are removed from the first load lock by atmospheric robot 703. The wafers are then replaced into the cassettes/FOUPS 701, where they are ready to move to the next production step. This system is superior because the second load lock is the only load lock open to the process chamber—and hence hydrogen gas—when wafers are loaded or unloaded. Yet, this second load lock is not pressurized to atmosphere or open to the atmosphere during normal operation.

Having described the present invention in detail above, it should be appreciated that an apparatus and methods are described herein for the highly advantageous removal of photoresist (PR) and/or residue utilizing mainly hydrogen gas for use in making transistors in IC fabrication. That is, the processes taught herein are useful prior to forming the electrical interconnect arrangement of the IC in what is often referred to as the front end processing. These processes are therefore understood to include the contact etch in which contact wells are formed through an overall insulative layer, immediately prior to starting the process of forming the electrical interconnect. The handling and process control system preferred uses multiple load locks and certain operating procedures to prevent any hydrogen from being released into the factory environment where it would be a fire/explosion hazard. One important advantage of the disclosed system and PR stripping processes resides in avoiding etching or oxidation of the silicon dioxide, silicon and silicides exposed on the wafer surface during this process. Exemplary applications for the system and process include stripping PR and removing residues following ion implantation or following certain etch steps during which critical surfaces of the transistors are exposed to the ambient of the process. The most important of these latter type of stripping processes follow patterning of the gate electrode or other etching steps for making transistors such as the "contact etch". Embodiments of the disclosed stripping method may use one or multiple steps having different gas or electrical conditions. Any/all steps may use substantial flows of hydrogen gas possibly mixed with substantial amounts of noble gas(es) and small amounts (a fraction of a percent to several percent) of oxygen, and/or nitrogen and/or fluorine containing gases. Such processes can be done in a chamber distinct from the plasma source where baffling permits substantially neutral species only to react with the wafer. Alternatively, one or more steps in the process can be performed wherein the plasma generated by the source is adjacent to the wafer, and additional power may be provided from the same source that generates the plasma or a separate source to increase energy of ions bombarding the wafer. In one embodiment, a chamber provides low to moderate energy ion bombardment for a final step which removes the post-stripping residues. Multiple process chambers may be used for sequentially processing the wafers with multi-step processes.

Although each of the aforedescribed physical embodiments have been illustrated with various components having particular respective orientations, it should be understood that the present invention may take on a variety of specific configurations with the various components being located in a wide variety of positions and mutual orientations. Furthermore, the methods described herein may be modified in an unlimited number of ways, for example, by reordering, modifying and recombining the various steps. Accordingly, it should be apparent that the arrangements and associated methods disclosed herein may be provided in a variety of different configurations and modified in an unlimited number of different ways, and that the present invention may be embodied in many other specific forms without departing from the spirit or scope of the invention. Therefore, the present examples and methods are to be considered as illustrative and not restrictive, and the invention is not to be limited to the details given herein, but may be modified at least within the scope of the appended claims.

What is claimed is:

1. In an overall technique for fabricating an integrated circuit on a wafer to include an active device structure which supports an electrical interconnect structure, and during an intermediate step, prior to forming said electrical interconnect structure, a patterned layer of photoresist is used in the overall technique and which patterned layer of photoresist is exposed to a high dose ion implant to form an implant crust as an outermost layer of the photoresist, and to form a junction in a silicon surface of said wafer, said implant crust being supported by an unaltered, bulk portion of the photoresist, a method comprising:
    prior to forming the electrical interconnect structure, exposing the patterned layer of photoresist and the exposed regions of the active device structure to one or more reactive species that are generated in a plasma using a gas mixture including hydrogen gas, as a predominant source of said reactive species and nitrogen gas without adding oxygen, in a plasma source to at least partially remove the implant crust from said patterned layer of photoresist and to remove at least some portion of the bulk photoresist such that the implant crust of the photoresist is continuously exposed to hydrogen-based reactive species during the removal of said photoresist to limit loss of silicon from said silicon surface of the wafer by oxidation.

2. The method of claim 1 wherein the nitrogen gas is a sole additive gas at rate of flow up to about 20% that of the hydrogen gas.

3. The method of claim 2 wherein said exposing selectively subjects said wafer primarily to neutral ones of said reactive species.

4. The method of claim 1 wherein stripping of said photoresist and removal of said residue is performed in a single step using (i) a process gas pressure is a range of approximately 400 mTorr to 2.5 Torr, (ii) a hydrogen gas flow, as part of said gas mixture, is between one and five standard liters per minute, (iii) a nitrogen flow, as part of said gas mixture, is approximately between 5% and 10% that of the hydrogen gas flow, (iv) a power level provided to the plasma source is between 500 Watts and 3000 Watts and (v) a temperature of said wafer is between 120 Celsius and 250 Celsius.

5. The method of claim 1 wherein said exposing uses (i) a gas pressure that is between about 2 mTorr to as much as about 5 Ton, (ii) a total flow of said gas mixture is from about 50 standard cubic centimeters per minute to as much as about 20 thousand standard cubic centimeters per minute per wafer, (iii) a power level that is provided to the plasma source is between about one hundred watts to as much as about 5 kilowatts and (iv) a temperature of said wafer is from room temperature up to about 350 degrees Celsius.

6. The method of claim 5 wherein the wafer temperature is at least initially less than 120 Celsius and said reactive species are energized using an RF power that is provided to a structure which supports the wafer to energize said reactive species moving to the wafer.

7. The method of claim 1 wherein exposing includes subjecting the wafer primarily to neutral ones of said reactive species from said plasma source without acceleration thereof.

8. The method of claim 1 wherein related residues are formed and wherein exposing includes subjecting the photoresist and related residues to said reactive species in at least two sequential steps using a first gas mixture and a second gas mixture to produce said reactive species wherein the first gas mixture is different from the second gas mixture, but each of the first and second gas mixtures includes hydrogen sufficient to cause the hydrogen to be the predominant source of the reactive species.

9. The method of claim 8 wherein said first gas mixture includes nitrogen gas in an amount up to about 20% of a rate of flow of the hydrogen gas and producing said plasma using an inductively coupled plasma source.

10. The method of claim 8 wherein said wafer is subjected primarily to neutral ones of said reactive species produced from said first gas mixture without acceleration thereof.

11. The method of claim 8 wherein said wafer is subjected to accelerated ones of said reactive species produced from said second gas mixture.

12. The method of claim 1 including maintaining said wafer at a temperature between 120 degrees Celsius and 300 degrees Celsius and producing said plasma using an inductively coupled plasma source.

13. The method of claim 1 wherein said gas mixture includes nitrogen gas and ammonia gas in an amount up to about 20% of a rate of flow of the hydrogen gas and producing said plasma using an inductively coupled plasma source.

14. The method of claim 1 wherein residues are formed and wherein exposing includes subjecting the photoresist and related residues to said reactive species in a series of steps using a series of different gas mixtures to produce a series of said reactive species, all of which include hydrogen as a predominant source of the reactive species.

15. The method of claim 14 wherein said sequential series of steps uses a set of process parameters including (i) gas pressures in said process chamber from about 2 mTorr to as much as about 5 Ton, (ii) a total flow of said gas mixture from about 50 standard cubic centimeters per minute to as much as about 20 thousand standard cubic centimeters per minute, (iii) a power level provided to said plasma source between about one hundred watts to as much as about 5 kilowatts, and (iv) a temperature of said wafer from room temperature up to about 350 degrees Celsius.

16. The method of claim 1 wherein exposing subjects the photoresist to one or more steps at a temperature of less than approximately 120 degrees Celsius and said reactive species are energized to remove or soften at least an outermost portion of the crust.

17. The method of claim 16 wherein during said exposing (i) a process pressure in said process chamber is from about 2 mTorr to as much as about 5 Ton, (ii) a total flow of said gas mixture is from about 50 standard cubic centimeters per minute to as much as about 20 thousand standard cubic centimeters per minute, (iii) a power level provided to the plasma source is between about 100 hundred watts to as much as about 5 kilowatts, and (iv) a temperature of said wafer is from room temperature up to about 350 degrees Celsius.

18. The method of claim 16 wherein the gas mixture includes nitrogen and ammonia with a rate of flow that is up to about 20% of that of a primary flow of hydrogen gas.

19. The method of claim 16 wherein (i) the primary flow of hydrogen is between two and five standard liters per minute, (ii) the nitrogen rate of flow is in a range of 5% to 10% of the primary flow of the hydrogen gas, (iii) a process pressure during said exposing is between 0.025 Torr and 1.3 Ton, (iv) the temperature of said wafer is up to 300 Celsius during said exposing, and the power level that is provided to the plasma source is between 900 Watts and 3000 Watts.

20. The method of claim 1 including producing said plasma with an inductively coupled plasma source.

21. The method of claim 20 wherein the nitrogen gas is a sole additive gas at rate of flow up to about 20% that of the hydrogen gas.

22. The method of claim 21 wherein said exposing selectively subjects said wafer primarily to neutral ones of said reactive species.

23. The method of claim 20 wherein stripping of said photoresist and removal of said residue is performed in a single step using (i) a process gas pressure is a range of approximately 400 mTorr to 2.5 Ton, (ii) a hydrogen gas flow, as part of said gas mixture, is between one and five standard liters per minute, (iii) a nitrogen flow, as part of said gas mixture, is between 5% and 10% that of the hydrogen gas flow, (iv) a power level provided to the plasma source is between 500 Watts and 3000 Watts and (v) a temperature of said wafer is between 120 Celsius and 250 Celsius.

* * * * *